United States Patent [19]

Katsumata et al.

[11] Patent Number: 5,751,771
[45] Date of Patent: May 12, 1998

[54] WAVEFORM DATA COMPRESSION APPARATUS AND WAVEFORM DATA EXPANSION APPARATUS

[75] Inventors: Masaaki Katsumata; Satoshi Kusakabe, both of Osaka, Japan

[73] Assignee: Roland Kabushiki Kaisha, Osaka, Japan

[21] Appl. No.: 467,573

[22] Filed: Jun. 5, 1995

[30] Foreign Application Priority Data

Oct. 7, 1994 [JP] Japan .................. 6-270334
Nov. 30, 1994 [JP] Japan .................. 6-321721

[51] Int. Cl.$^6$ .................................................. H04B 1/66
[52] U.S. Cl. ............................................................ 375/240
[58] Field of Search .................................. 375/240, 241; 381/34, 35, 29, 30; 370/7; 364/724.1, 723; 341/87, 144, 155, 166

[56] References Cited

U.S. PATENT DOCUMENTS

| 4,396,906 | 8/1983 | Weaver ............... 340/347 |
| 4,715,257 | 12/1987 | Hoshiai et al. ........ 84/1.01 |
| 4,781,096 | 11/1988 | Suzuki et al. ......... 84/1.01 |
| 5,379,241 | 1/1995 | Gregpain ............. 364/723 |

FOREIGN PATENT DOCUMENTS 167900  7/1989  Japan.

Primary Examiner—Stephen Chin
Assistant Examiner—Kevin Kim
Attorney, Agent, or Firm—Lyon & Lyon, LLP

[57] ABSTRACT

The present invention provides a waveform data compression apparatus which can express waveform data by a small amount of compression data obtained by compressing the aforesaid waveform data, and a waveform data expansion apparatus which can reproduce the compression data produced by the aforesaid waveform data compression apparatus to obtain the original waveform data. The waveform data compression apparatus interpolates waveform data of addresses before and behind the waveform data of an objective address in a block to be processed to acquire interpolated data of the objective address to be processed, and uses difference data between the interpolated data and the waveform data of the objective address to be processed, thereby compressing the waveform data. The waveform data expansion apparatus operates to perform reverse process to that performed by the waveform data compression apparatus.

20 Claims, 19 Drawing Sheets

ONE EXAMPLE FOR PRODUCING COMPRESSION DATA

| ADDRESS | DIFFERENCE VALUE | WORD LENGTH | QUANTIZATION VALUE 1 | ERROR 1 | QUANTIZATION VALUE 2 | ERROR 2 |
|---|---|---|---|---|---|---|
| 1 | 0014 | 2 | 0018 | 0004 | 000c | 0008 |
| 2 | 0035 | 4 | 0038 | 0003 | 0034 | 0001 |
| 3 | 000c | 2 | 0008 | 0004 | 000c | 0000 |
| 4 | 0176 | 6 | 0178 | 0002 | 0174 | 0002 |
| 5 | 0004 | 2 | 0008 | 0004 | 0004 | 0000 |
| 6 | 0021 | 4 | 0028 | 0007 | 0024 | 0003 |
| 7 | 0002 | 2 | 0008 | 0006 | 0004 | 0002 |
| 8 | 03e6 | 8 | 03e8 | 0002 | 03e4 | 0002 |
| (SUM SQUARE OF QUANTIZATION ERROR →) | | | | 0096 | | 0056 |

| PATTERN CODE | EXPONENT | ADDRESS | 1 | 2 | 3 | 4 | 5 | 6 | 7 | 8 |
|---|---|---|---|---|---|---|---|---|---|---|
| 0000 | 0 | | 2 | 3 | 2 | 6 | 2 | 3 | 2 | 8L |
| 0001 | 2 | | 2 | 3 | 2 | 6 | 2 | 3 | 2 | 8L |
| 0010 | 3 | | 2 | 3 | 2 | 6 | 2 | 3 | 2 | 8L |
| 0011 | 4 | | 2 | 3 | 2 | 6 | 2 | 3 | 2 | 8L |
| 010 | 5 | | 2 | 4 | 2 | 5 | 2 | 3 | 2 | 9L |
| 1010 | 5 | | 2 | 3 | 2 | 6 | 2 | 3 | 2 | 8L |
| 011 | 6 | | 2 | 4 | 2 | 5 | 2 | 3 | 2 | 9L |
| 1011 | 6 | | 2 | 3 | 2 | 6 | 2 | 3 | 2 | 8L |
| 100 | 7 | | 2 | 4 | 2 | 5 | 2 | 3 | 2 | 9L |
| 1100 | 7 | | 2 | 3 | 2 | 6 | 2 | 3 | 2 | 8L |
| 1101 | 8 | | 2 | 3 | 2 | 6 | 2 | 3 | 2 | 8L |
| 11100 | 9 | | 2 | 3 | 2 | 6 | 2 | 3 | 2 | 7L |
| 11101 | a | | 2 | 4 | 2 | 6L | 2 | 3 | 2 | 6L |
| 11110 | b | | 3 | 4 | 2 | 5L | 2 | 4 | 2 | 5L |
| 111110 | c | | 3 | 4L | 3 | 4L | 2 | 4L | 2 | 4L |
| 111111 | d | | 3L | 3L | 3L | 4L | 3L | 3L | 3L | 4L |

| PATTERN CODE | EXPONENT | ADDRESS | 1 | 2 | 3 | 4 | 5 | 6 | 7 | 8 |
|---|---|---|---|---|---|---|---|---|---|---|
| 110000 | 0 | | 2 | 3 | 2 | 6 | 2 | 3 | 2 | 9L |
| 110001 | 1 | | 2 | 3 | 2 | 6 | 2 | 3 | 2 | 9L |
| 110010 | 2 | | 2 | 3 | 2 | 6 | 2 | 3 | 2 | 9L |
| | | | | | | | | | | |
| 0000 | 3 | | 2 | 4 | 2 | 6 | 2 | 4 | 2 | 8L |
| 0110 | 3 | | 2 | 4 | 2 | 5 | 2 | 4 | 2 | 9L |
| 110011 | 3 | | 2 | 3 | 2 | 6 | 2 | 3 | 2 | 9L |
| 111000 | 3 | | 2 | 3 | 2 | 5 | 2 | 3 | 2 | aL |
| | | | | | | | | | | |
| 0001 | 4 | | 2 | 4 | 2 | 6 | 2 | 4 | 2 | 8L |
| 0111 | 4 | | 2 | 4 | 2 | 5 | 2 | 4 | 2 | 9L |
| 110100 | 4 | | 2 | 3 | 2 | 6 | 2 | 3 | 2 | 9L |
| 111001 | 4 | | 2 | 3 | 2 | 5 | 2 | 3 | 2 | aL |
| | | | | | | | | | | |
| 0010 | 5 | | 2 | 4 | 2 | 6 | 2 | 4 | 2 | 8L |
| 1000 | 5 | | 2 | 4 | 2 | 5 | 2 | 4 | 2 | 9L |
| 110101 | 5 | | 2 | 3 | 2 | 6 | 2 | 3 | 2 | 9L |
| 111010 | 5 | | 2 | 3 | 2 | 5 | 2 | 3 | 2 | aL |
| | | | | | | | | | | |
| 0011 | 6 | | 2 | 4 | 2 | 6 | 2 | 4 | 2 | 8L |
| 1001 | 6 | | 2 | 4 | 2 | 5 | 2 | 4 | 2 | 9L |
| 110110 | 6 | | 2 | 3 | 2 | 6 | 2 | 3 | 2 | 9L |
| 111011 | 6 | | 2 | 3 | 2 | 5 | 2 | 3 | 2 | aL |
| | | | | | | | | | | |
| 0100 | 7 | | 2 | 4 | 2 | 6 | 2 | 4 | 2 | 8L |
| 1010 | 7 | | 2 | 4 | 2 | 5 | 2 | 4 | 2 | 9L |
| 110111 | 7 | | 2 | 3 | 2 | 6 | 2 | 3 | 2 | 9L |
| | | | | | | | | | | |
| 0101 | 8 | | 2 | 4 | 2 | 6 | 2 | 4 | 2 | 8L |
| 111100 | 9 | | 2 | 4 | 2 | 6 | 2 | 4 | 2 | 7L |
| 111101 | a | | 2 | 4 | 2 | 6L | 2 | 4 | 2 | 7L |
| 1011 | b | | 3 | 4 | 3 | 5L | 3 | 4 | 3 | 5L |
| 111110 | c | | 3 | 4L | 3 | 4L | 3 | 4L | 3 | 5L |
| 111111 | d | | 4L | 3L | 4L | 3L | 4L | 3L | 4L | 4L |

FIG. 17

| PATTERN CODE | EXPONENT | ADDRESS | 1 | 2 | 3 | 4 | 5 | 6 | 7 | 8 | SUM TOTAL OF WORD LENGTH |
|---|---|---|---|---|---|---|---|---|---|---|---|
| 110000 | 0 |  | 2 | 3 | 2 | 6 | 2 | 3 | 2 | 9L | 40 |
| 110001 | 1 |  | 2 | 3 | 2 | 6 | 2 | 3 | 2 | 9L | 40 |
| 110010 | 2 |  | 2 | 3 | 2 | 6 | 2 | 3 | 2 | 9L | 40 |
| 0000 | 3 |  | 2 | 4 | 2 | 6 | 2 | 4 | 2 | 8L | 40 |
| 0110 | 3 |  | 2 | 4 | 2 | 5 | 2 | 4 | 2 | 9L | 40 |
| 110011 | 3 |  | 2 | 3 | 2 | 6 | 2 | 3 | 2 | 9L | 40 |
| 111000 | 3 |  | 2 | 3 | 2 | 5 | 2 | 3 | 2 | aL | 40 |
| 0001 | 4 |  | 2 | 4 | 2 | 6 | 2 | 4 | 2 | 8L | 40 |
| 0111 | 4 |  | 2 | 4 | 2 | 5 | 2 | 4 | 2 | 9L | 40 |
| 110100 | 4 |  | 2 | 3 | 2 | 6 | 2 | 3 | 2 | 9L | 40 |
| 111001 | 4 |  | 2 | 3 | 2 | 5 | 2 | 3 | 2 | aL | 40 |
| 0010 | 5 |  | 2 | 4 | 2 | 6 | 2 | 4 | 2 | 8L | 40 |
| 1000 | 5 |  | 2 | 4 | 2 | 5 | 2 | 4 | 2 | 9L | 40 |
| 110101 | 5 |  | 2 | 3 | 2 | 6 | 2 | 3 | 2 | 9L | 40 |
| 111010 | 5 |  | 2 | 3 | 2 | 5 | 2 | 3 | 2 | aL | 40 |
| 0011 | 6 |  | 2 | 4 | 2 | 6 | 2 | 4 | 2 | 8L | 40 |
| 1001 | 6 |  | 2 | 4 | 2 | 5 | 2 | 4 | 2 | 9L | 40 |
| 110110 | 6 |  | 2 | 3 | 2 | 6 | 2 | 3 | 2 | 9L | 40 |
| 111011 | 6 |  | 2 | 3 | 2 | 5 | 2 | 3 | 2 | aL | 40 |
| 0100 | 6 |  | 3 | 5 | 3 | 7 | 3 | 5 | 3 | 9L | 50 |
| 1010 | 6 |  | 3 | 5 | 3 | 6 | 3 | 5 | 3 | aL | 50 |
| 110111 | 6 |  | 3 | 4 | 3 | 7 | 3 | 4 | 3 | aL | 50 |
| 0101 | 6 |  | 4 | 6 | 4 | 8 | 4 | 6 | 4 | aL | 60 |
| 111100 | 7 |  | 4 | 6 | 4 | 8 | 4 | 6 | 4 | 9L | 60 |
| 111101 | 8 |  | 4 | 6 | 4 | 8L | 4 | 6 | 4 | 9L | 60 |
| 1011 | 8 |  | 6 | 7 | 6 | 8L | 6 | 7 | 6 | 8L | 70 |
| 111110 | 8 |  | 7 | 8L | 7 | 8L | 7 | 8L | 7 | 9L | 80 |
| 111111 | 9 |  | 8L | 7L | 8L | 7L | 8L | 7L | 8L | 8L | 80 |

FIG. 18

| PATTERN CODE | EXPONENT | 1 | 2 | 3 | 4 | 5 | 6 | 7 | 8 | CHANGE IN THE LEAST PLASE OF MANTISSA |
|---|---|---|---|---|---|---|---|---|---|---|
| 11101111 | d | 3L | 4L | 3L | 4L | 3L | 4L | 3L | 4L | -2 |
| 11101110 | c | 3 | 4L | 3 | 4L | 3 | 4L | 3 | 4L | -2 |
| 11101101 | b | 3 | 4L | 3 | 4L | 3 | 4L | 3 | 4L | -2 |
| 11101100 | a | 3 | 4L | 3 | 4L | 3 | 4L | 3 | 4L | -2 |
| 11101011 | 9 | 3 | 4L | 3 | 4L | 3 | 4L | 3 | 4L | -1 |
| 11101010 | 8 | 3 | 4L | 3 | 4L | 3 | 4L | 3 | 4L | -1 |
| | | | | | | | | | | |
| 10\*\*11\*\* | b | 3 | 4 | 3 | 5L | 3 | 4 | 3 | 5L | -2 |
| 10\*\*10\*\* | a | 3 | 4 | 3 | 5L | 3 | 4 | 3 | 5L | -2 |
| 10\*\*01\*\* | 9 | 3 | 4 | 3 | 5L | 3 | 4 | 3 | 5L | -1 |
| 10\*\*00\*\* | 8 | 3 | 4 | 3 | 5L | 3 | 4 | 3 | 5L | -1 |
| 01\*\*11\*\* | 7 | 3 | 4 | 3 | 5L | 3 | 4 | 3 | 5L | -1 |
| 01\*\*10\*\* | 6 | 3 | 4 | 3 | 5L | 3 | 4 | 3 | 5L | 0 |
| | | | | | | | | | | |
| 11111010 | a | 2 | 4 | 2 | 6L | 2 | 4 | 2 | 6L | -2 |
| 111\*100\* | 9 | 2 | 4 | 2 | 6 | 2 | 4 | 2 | 7L | -2 |
| 111\*011\* | 8 | 2 | 4 | 2 | 6 | 2 | 4 | 2 | 7L | -2 |
| 111\*010\* | 7 | 2 | 4 | 2 | 6 | 2 | 4 | 2 | 7L | -1 |
| 111\*001\* | 6 | 2 | 4 | 2 | 6 | 2 | 4 | 2 | 7L | -1 |
| 111\*000\* | 5 | 2 | 4 | 2 | 6 | 2 | 4 | 2 | 7L | 0 |
| 110\*111\* | 4 | 2 | 4 | 2 | 6 | 2 | 4 | 2 | 7L | 0 |
| | | | | | | | | | | |
| 110\*110\* | 8 | 2 | 4 | 2 | 5 | 2 | 4 | 2 | 8L | -2 |
| 01\*\*01\*\* | 7 | 2 | 4 | 2 | 5 | 2 | 4 | 2 | 9L | -1 |
| 01\*\*00\*\* | 6 | 2 | 4 | 2 | 5 | 2 | 4 | 2 | 9L | -1 |
| 00\*\*11\*\* | 5 | 2 | 4 | 2 | 5 | 2 | 4 | 2 | 9L | 0 |
| 00\*\*10\*\* | 4 | 2 | 4 | 2 | 5 | 2 | 4 | 2 | 9L | 0 |
| 00\*\*01\*\* | 3 | (2) | 4 | (2) | 5 | (2) | 4 | (2) | 9L | 1 |
| 00\*\*00\*\* | 2 | - | 4 | - | 5 | - | 4 | - | 9L | 1 |
| | | | | | | | | | | |
| 110\*101\* | 6 | 2 | 3 | 2 | 5 | 2 | 3 | 2 | aL | -1 |
| 110\*100\* | 5 | 2 | 3 | 2 | 5 | 2 | 3 | 2 | aL | 0 |
| 110\*011\* | 4 | 2 | 3 | 2 | 5 | 2 | 3 | 2 | aL | 0 |
| 110\*010\* | 3 | (2) | 3 | (2) | 5 | (2) | 3 | (2) | aL | 1 |
| 110\*001\* | 2 | - | 3 | - | 5 | - | 3 | - | aL | 1 |
| 110\*000\* | 1 | - | 3 | - | 5 | - | 3 | - | aL | 1 |
| | | | | | | | | | | |
| 11111100 | 1 | - | - | - | 4 | - | - | - | 8L | 0 |
| 11111011 | 0 | - | - | - | 4 | - | - | - | 8L | 0 |

PATTERN CODE 0000-0011

| PATTERN CODE | d (8) | | | d (7) | d (6) |
|---|---|---|---|---|---|
| PATTERN CODE | d (10) | | | d (f) | d (a) |
| d (5) | d (4) | | d (3) | d (2) | d (1) |
| d (d) | d (c) | | d (b) | d (a) | d (9) |

FIG. 21B

PATTERN CODE 0110-1001

| PATTERN CODE | d (8) | | | d (7) | d (6) |
|---|---|---|---|---|---|
| PATTERN CODE | d (10) | | | d (f) | d (e) |
| | d (5) | d (4) | d (3) | d (2) | d (1) |
| | d (d) | d (c) | d (b) | d (a) | d (9) |

FIG. 21C

PATTERN CODE 110000-110110

| PATTERN CODE | d (8) | | | d (7) | d (6) |
|---|---|---|---|---|---|
| PATTERN CODE | d (10) | | | d (f) | d (e) |
| | d (5) | d (4) | d (3) | d (2) | d (1) |
| | d (d) | d (c) | d (b) | d (a) | d (9) |

FIG. 21D

PATTERN CODE 111000-111011

| PATTERN CODE | d (8) | | | | d (7) | |
|---|---|---|---|---|---|---|
| PATTERN CODE | d (10) | | | | d (f) | |
| d (6) | d (5) | d (4) | | d (3) | d (2) | d (1) |
| d (e) | d (d) | d (c) | | d (b) | d (a) | d (9) |

FIG. 22A

PATTERN CODE 0100

| PATTERN CODE | d (8) | | d (7) | d (6) |
|---|---|---|---|---|
| PATTERN CODE | d (10) | | d (f) | d (e) |
| d (6) | d (5) | d (4) | | d (3) |
| d (e) | d (d) | d (c) | | d (b) |
| d (2) | | d (1) | d (a) | d (9) |

FIG. 22B

PATTERN CODE 1010

| PATTERN CODE | d (8) | | d (7) | |
|---|---|---|---|---|
| PATTERN CODE | d (10) | | d (f) | |
| d (6) | d (5) | d (4) | | d (3) |
| d (e) | d (d) | d (c) | | d (b) |
| d (2) | | d (1) | d (a) | d (9) |

FIG. 22C

PATTERN CODE 110111

| PATTERN CODE | d (8) | | d (7) |
|---|---|---|---|
| PATTERN CODE | d (10) | | d (f) |
| d (6) | d (5) | d (4) | d (3) |
| d (e) | d (d) | d (c) | d (b) |
| d (3) | d (2) | d (1) | d (b) | d (a) | d (9) |

FIG. 23A

PATTERN CODE 0101

| PATTERN CODE | d (8) | | d (7) |
|---|---|---|---|
| PATTERN CODE | d (10) | | d (f) |
| d (6) | d (5) | | d (4) |
| d (e) | d (d) | | d (c) |
| d (4) | d (3) | d (2) | d (1) |
| d (C) | d (b) | d (a) | d (9) |

FIG. 23B

PATTERN CODE 111100, 111101

| PATTERN CODE | d (8) | | d (7) |
|---|---|---|---|
| PATTERN CODE | d (10) | | d (f) |
| d (6) | d (5) | | d (4) |
| d (e) | d (d) | | d (c) |
| d (4) | d (3) | d (2) | d (1) |
| d (C) | d (b) | d (a) | d (9) |

FIG. 23C

PATTERN CODE 1011

| PATTERN CODE | d (8) | | d (7) |
|---|---|---|---|
| PATTERN CODE | d (10) | | d (f) |
| d (6) | | d (5) | d (4) |
| d (e) | | d (d) | d (c) |
| d (4) | d (3) | | d (2) |
| d (C) | d (b) | | d (a) |
| d (2) | d (1) | d (a) | d (9) |

PATTERN CODE 111110

| PATTERN CODE | d (8) | | d (7) |
|---|---|---|---|
| PATTERN CODE | d (10) | | d (f) |
| d (7) | d (6) | | d (5) |
| d (f) | d (e) | | d (d) |
| d (5) | d (4) | | d (3) |
| d (d) | d (C) | | d (b) |
| | d (2) | | d (1) |
| | d (a) | | d (9) |

FIG. 24A

PATTERN CODE 111111

| PATTERN CODE | d (8) | | d (7) |
|---|---|---|---|
| PATTERN CODE | d (10) | | d (f) |
| d (7) | d (6) | | d (5) |
| d (f) | d (e) | | d (d) |
| d (5) | d (4) | | d (3) |
| d (d) | d (C) | | d (b) |
| | d (2) | | d (1) |
| | d (a) | | d (9) |

FIG. 24B

WAVEFORM DATA COMPRESSION APPARATUS AND WAVEFORM DATA EXPANSION APPARATUS

BACKGROUND OF THE INVENTION

1. Field of the Invention

The present invention relates to a waveform data compression apparatus and a waveform data expansion apparatus, and more particularly to a waveform data compression apparatus in which waveform data are compressed, and the same waveform data are expressed by a small amount of the resulting compressed data as well as to a waveform data expansion apparatus by which the original waveform data are reproduced by expanding the compression data obtained from the aforesaid waveform data compression apparatus.

2. Description of the Related Art

In general, frequency contains a less higher harmonic component in waveforms which change with shift of time such as aural waveforms or video waveforms, so that such a waveform indicates a gentle slope (FIG. 1). In the present invention, changes in waveform levels between adjacent picture elements in case of video waveforms and changes in waveform levels between adjacent frames in specified picture elements are also included in the concept of "waveforms changing with shift of time".

Heretofore, in case of recording, transmitting or processing similarly digital data of waveforms, the waveform data have been compressed as described hereinbelow to store the data compressed in a memory, whereby information of high precision has been obtained with a small amount of data in view of the property wherein waveforms have gentle slopes.

More specifically, in a series of process for storing waveform data composed of from a(0) to a(N) (N: positive integer) in a memory, then reading out the same to reproduce the data, all of the a(n) have not been stored, but only the beginning a(0) has been stored as it is, thereafter a difference between a(n) and a(n−1), i.e. "d(n)=a(n)−a(n−1)" has been stored, and "a(n a(n−1)+d(n)" has been calculated to obtain a value a(n) in case of reproducing the data.

Since waveform data changing with shift of time have generally a gentle slope, both waveform data having a before and after relationship with each other in view of time exhibit a strong correlation. Thus, in accordance with the manner as described above, a difference between a(n) and a(n−1) becomes small, so that a data length of d(n) is shorter than that of a(n) according to digital expression. Accordingly, it could have been intended to compress waveform data, and then to expand the data compressed to reproduce the same (FIG. 1).

Furthermore, as disclosed in U.S. Pat. No. 4,396,906, there has been a method wherein a value d(n)=0.5*a(n−1)−a(n)+0.5*a(n+1) is calculated as respective values n, in place of all the a(n), the beginning a(0), a(1), and the respective d(n) are stored, and a(n+1)=2*(a(n)+d(n))−a(n−1) is successively calculated in case of reproducing data to obtain a(n+1). In this method, since a correlation of three data being continuous with a shift of time is utilized, it is possible to use difference data expressed with a shorter word length than that of the above-mentioned method. More specifically, a value d(n) in the above described U.S. Patent becomes very close to "0", so that a word length required for storing such a value is extremely short (FIG. 2) as compared with the method wherein a difference between a certain data and the immediately before data is merely obtained as in d(n)=a(n)−a(n−1).

According to the above described method, however, there is such an operation that d(n) is doubled at the time of reproduction, so that it has been necessary for storing excessively d(n) with about 1 bit in binary expression than the original significant figures.

Furthermore, there is such a case where a reproduced value a(n) cannot suitably be obtained by influences of internal noises arising in normal application of the circuits of compression apparatuses and expansion apparatuses in the above-mentioned prior art, influences of external noises being subjected to conventional devices of a transmission system, or errors arising in case of writing data into or reading out from a memory device in normal application of the compression apparatuses and the expansion apparatuses. Such phenomena are hereinafter referred to as "unexpected error of a(n)" in the present specification.

In both the above described method for compressing data in accordance with "d(n)=a(n)−a(n−1)" and the method disclosed in the above described U.S. Pat. No. 4,396,906, since reproduction data are successively calculated with increase of n, when a reproduced value a(n) is not appropriately obtained due to the above-mentioned unexpected error, there has been such a disadvantage in that the adverse influences extend over all of the following respective reproduced values, i.e. a(n+1), a(n+2), a(n+3) . . . .

Moreover, there is such a case where reproduction of data in the course of time series, for example, from address data a(k) is required in application of the expansion apparatus. In this respect, according to the methods of the above described prior art, such a complicated manner that first, data from the beginning a(0) to the immediately before data a(k−1) are reproduced, and then the data a(k) in question and the following data are reproduced must inevitably be conducted.

OBJECTS AND SUMMARY OF THE INVENTION

In recent data recording, data transmission, data communication and the like fields, desired has been a development of a waveform data compression apparatus and a waveform data expansion apparatus by which more precise information can be obtained with a small amount of data, unexpected errors can be affected less adversely, and data can be advantageously reproduced even in the course of time series.

The present invention has been made in view of needs for improving the disadvantages involved in the prior art. Accordingly, an object of the present invention is to provide a waveform data compression apparatus for compressing waveform data to form compressed waveform data with a small amount of waveform data as well as to provide a waveform data expansion apparatus for expanding the compressed waveform data to reproduce the original waveform data. Another object of the invention is to provide a waveform data compression apparatus and a waveform data expansion apparatus which are scarcely influenced by unexpected errors and further suitable for reproducing the original data in the course of time series.

In order to attain the above described objects, the waveform data compression apparatus and the waveform expansion apparatus according to the present invention have been made with taking the following points into consideration. In this connection, it is to be noted that a term "address" is used to discriminate respective data arranged in time series in the following description.

The present invention uses the following matters as its' fundamental principles in case of compressing waveform data composed of (N+1) data extending over from a(0) to a(N) (N:positive integer), and further expanding the data thus compressed to reproduce the original data.

Namely, the first matter is such that compression of data is conducted by employing difference data obtained from objective address data to be processed and data of a value conjectured from before and behind address data of the objective address data, while reproduction of the objective address data to be processed is conducted by employing a value of data conjectured from before and behind address data of the objective address data to be processed and the aforesaid compression data.

The second matter is such that at least one original sample data which are to be treated as compression data without taking a difference from a value conjectured from the other data are prepared in a certain blocks of addresses, and on the basis of the data in question, data of before and behind addresses of the former data are adapted to be expandible.

More specifically, in place of storing a(2n-1) (n: positive integer) being odd number address data, a difference between this odd number address data and an arithmetic mean of immediately before address data a(2n-2) and immediately after address data a(2n) with respect to the odd number address data, i.e. "d(2n-1)=a(2n-1)-(a(2n-2)+a(2n))/2" is stored, while calculation "a(2n-1)=d(2n-1)+(a(2n-2)+a(2n))/2" is made in case of reproducing data.

In the present invention, a value d(n) being a difference between an original sample data and a value conjectured from the other data prepared in accordance with the manner as described above is referred to as "difference data" hereinbelow. On one hand, when an original sample data is handled without any modification, in other words, when a difference between the original sample data and a value conjectured from the other data is not calculated, such original sample data is called by "linear data" for the sake of discriminating from "difference data".

Next, in place of storing a(4n-2) (n: positive integer) being data of an address having remainder "2" as a result of division by "4", a difference between the address data in question a(4n-2) and an arithmetic mean of immediately before address data a(4n-4) being address data of multiples of "4" and immediately after address data a(4n) being address data of multiples of "4" with respect to the address data in question, i.e. "d(4n-2)=a(4n-2)-(a(4n-4)+a(4n))/2" is stored.

In this case, the d(4n-2) requires somewhat longer word length than that of the case of difference data between the same and an arithmetic mean of immediately before and after data.

Furthermore, likewise in place of storing a(8n-4) (n: positive integer) being data of an address having remainder "4" as a result of division by "8", when "d(8n-4)=a(8n-4)-(a(8n-8)+a(8n))/2" is stored, linear data are sufficient for only addresses of multiples of "8", and the remaining addresses can be expressed by difference data.

For instance, to obtain difference data of a(1), a(2), a(3), a(4), a(5), a(6), and a(7), it is sufficient for conducting the following calculations from (2) to (8) (FIG. 3). In this case, for convenience's sake, a(8) is used as d(8) without any modification.

(1) d(8) = a(8)
(2) d(4) = a(4) - (a(0) + a(8))/2
(3) d(2) = a(2) - (a(0) + a(4))/2
(4) d(6) = a(6) - (a(4) + a(8))/2

-continued (5) d(1) = a(1) - (a(0) + a(2))/2
(6) d(3) = a(3) - (a(2) + a(4))/2
(7) d(5) = a(5) - (a(4) + a(6))/2
(8) d(7) = a(7) - (a(6) + a(8))/2

In case of the waveform as shown in FIG. 3, it is required for assigning a longer word length to d(2) and d(6) than that of d(1), d(3), d(5), and d(7), furthermore it is required for assigning a still longer word length to d(4), and a much longer word length to d(8), respectively.

Moreover, according to the present invention, a series of waveform data are divided into a plurality of blocks to form blocks of data (blocking), an exponent being common in data blocks is established in every blocks, and respective expressed with exponent and mantissas in accordance with point method, so that compression data are formed on the basis of the exponent and these mantissas.

The blocking is made prior to the above described difference data in such a manner that a plurality (8, 16, 32 and the like) of sample data are collected in address order to form a block. In the following description, the term "address" is used for discriminating also the respective data in blocks so far as there is no fear of confusion.

Difference data d(i) being the objective of floating-point have different word lengths to be assigned in case of compression in accordance with addresses as described above. In this respect, for example, an explanation will be made on the case shown in FIG. 3. One block is composed of from address "1" to address "8". (Address a(0) is arranged to belong to the preceding block.) A word length to be allocated to the respective addresses in one as follows:

8 bit is allocated to d(8)

6 bit is allocated to d(4)

4 bit is allocated to d(2) and d(6)

2 bit is allocated to d(1), d(3), d(5), and d(7)

In the case when an exponent being common in one block is decided, a value which is obtained by adding the exponent to a prescribed word length in question is made to be the one which can reach the uppermost place of significant figures of corresponding data and among others, it is the smallest value. Then, the respective data are rounded off in accordance with the resulting exponents to form mantissa values.

It is to be noted that the above described manner for allocating word lengths such as 8 bit, 6 bit, 4 bit, and 2 bit to respective addresses in one block relates to only an example, and other manners for allocating word lengths such as 9 bit, 5 bit, 4 bit, 2 bit and the like may also be applied.

When such a manner for allocating word lengths such as 9 bit, 7 bit, 5 bit, 3 bit and the like to respective addresses in one block is conducted, a total amount of mantissa data changes, whereby compression data having a different compressibility come to be obtained.

On the other hand, in the waveform data expansion apparatus according to the present invention, the reverse processing to that of the above described waveform data compression apparatus is carried out to expand data compressed, thereby to reproducing the original data. Namely, the following calculations are conducted:

(1) a(8) = d(8)
(2) a(4) = d(4) + (a(0) + a(8))/2

-continued (3) $a(2) = d(2) + (a(0) + a(4))/2$
(4) $a(6) = d(6) + (a(4) + a(8))/2$
(5) $a(1) = d(1) + (a(0) + a(2))/2$
(6) $a(3) = d(3) + (a(2) + a(4))/2$
(7) $a(5) = d(5) + (a(4) + a(6))/2$
(8) $a(7) = d(7) + (a(6) + a(8))/2$ As described above, in the reproducing method according to the present invention, even if an unexpected error occurs, the influences thereby remain in the corresponding block (in case of a(8), the influences thereby remain in the following block at the most), but not propagate infinitely.

Furthermore, in accordance with the reproducing method according to the present invention, when reproduction is intended from data at the address in the course of time series, it is not necessary for reproducing the same from the beginning data, but it is sufficient for reproducing the same from the block containing the address in question and the final data in the immediately before block.

Still further, in the reproducing method according to the present invention, difference data are merely added to an arithmetic mean of reproduced values of before and behind addresses of the address in question, so that a precision of the difference data reflects on that of the reproduced value as it is. Accordingly, regarding odd number addresses, the same degree of precision with a word length being shorter by about 1 bit in binary expression as that of the previous U.S. Pat. No. 4,396,906 can be expected.

Namely, the waveform data compression apparatus according to the present invention has been provided in view of the above described fundamental principle, and the waveform data compression apparatus comprises a first conjecture means for determining a first conjecture data based on at least data at a first time and data at a second time, said first conjecture data being the conjecture data of data at a third time existing during a period of time between said first time and said second time; a first difference means for determining a difference value between the data at said third time and the first conjecture data conjectured by said first conjecture means; a second conjecture means for determining a second conjecture data based on at least the data at said first time and the data at said third time, said second conjecture data being the conjecture data of data at a fourth time existing during a period of time between said first time and said third time; and a second difference means for determining a difference value between the data at said fourth time and the second conjecture data conjectured by said second conjecture means; whereby data indicating a difference value of the data at said third time and data indicating a difference value of the data at said fourth time are produced on the basis of the difference values determined by said first and second difference means, respectively.

Furthermore, the waveform data expansion apparatus according to the present invention comprises a first conjecture means for determining a first conjecture data based on at least data at a first time and data at a second time, said first conjecture data being the conjecture data of data at a third time existing during a period of time between said first time and said second time; a first addition means for adding said first conjecture data determined by said first conjecture means to data indicating a difference value of the data at said third time to produce the result as the data at said third time; a second conjecture means for determining a second conjecture data based on at least the data at said first time and the data at said third time which are produced by said first addition means, said second conjecture data being the conjecture data of data at a fourth time existing during a period of time between said first time and said third time; and a second addition means for adding said second conjecture data determined by said second conjecture means to data indicating a difference value of the data at said fourth time to produce the result as the data at said fourth time.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 17 is a diagram showing the second example of pattern codes;

FIG. 18 is a diagram showing the third example of pattern codes;

FIG. 19 is a diagram showing the fourth example of pattern codes;

FIG. 21 is an explanatory view showing an example of the formation of compression data in the case where the pattern codes shown in FIG. 18 are adopted as its pattern codes;

FIG. 22 is an explanatory view showing an example of the formation of compression data in the case where the pattern codes shown in FIG. 18 are adopted as its pattern codes;

FIG. 23 is an explanatory view showing an example of the formation of compression data in the case where the pattern codes shown in FIG. 18 are adopted as its pattern codes;

FIG. 24 is an explanatory view showing an example of the formation of compression data in the case where the pattern codes shown in FIG. 18 are adopted as its pattern codes;

DETAILED DESCRIPTION OF THE PREFERRED EMBODIMENTS

The waveform data compression apparatus and the waveform data expansion apparatus according to the present invention will be described in detail hereinbelow by referring to the accompanying drawings.

In the following embodiments, it is to be noted that while examples are indicated by two's complement of 16 bit, the present invention is not limited thereto.

[Explanation of the waveform data compression apparatus]

Figure 1:
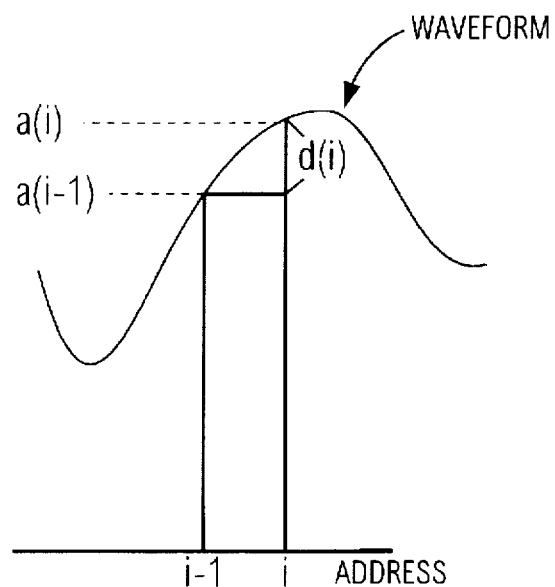
FIG. 1 is an explanatory diagram illustrating a conventional method for compressing waveform data.
Figure 2:
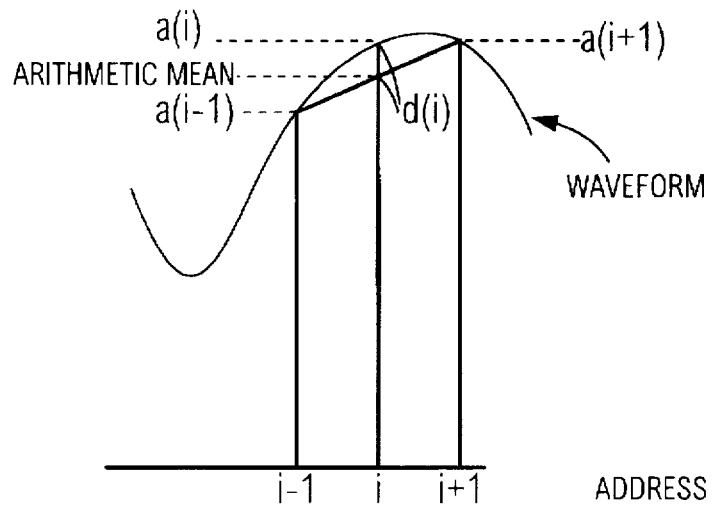
FIG. 2 is an explanatory diagram illustrating a principle of the method for compressing waveform data according to the present invention.
Figure 3:
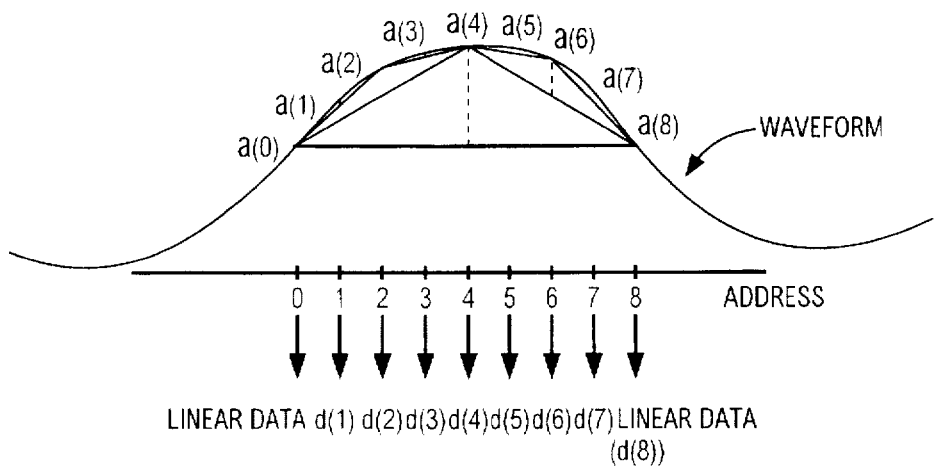
FIG. 3 is an explanatory diagram illustrating a principle of the method for compressing waveform data according to the present invention.
Figure 4:
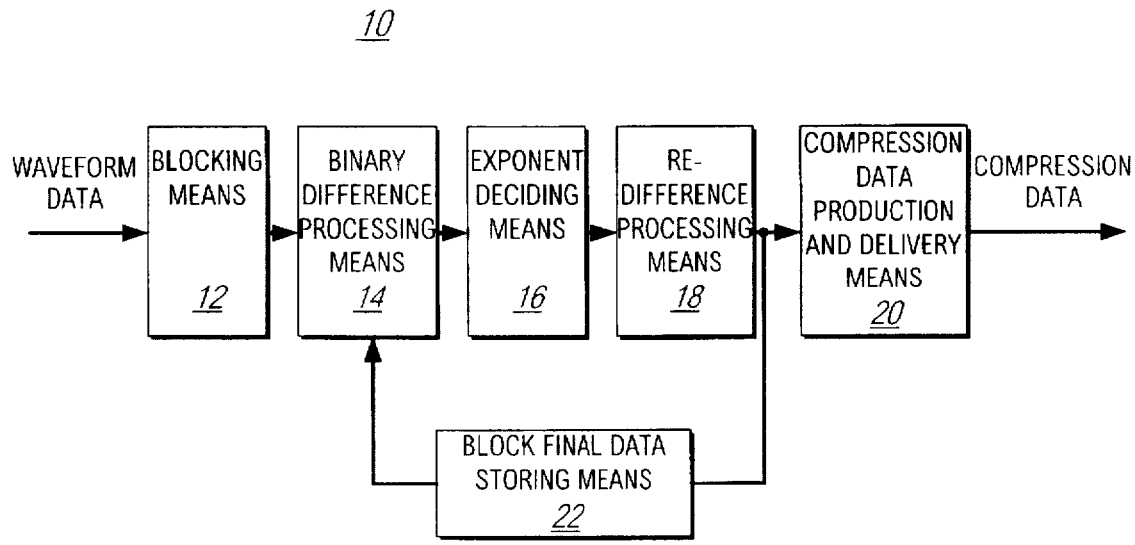
FIG. 4 is block diagram showing the waveform data compression apparatus according to an embodiment of the present invention.

FIG. 4 is a block diagram showing an embodiment of the present invention wherein all the operations of this waveform data compression apparatus are controlled by means of microcomputers. In the following description, numerals excluding reference numerals attached to the accompanying drawings are indicated by hexadecimal number, otherwise specifically indicated.

The waveform data compression apparatus 10 comprises a blocking means 12 for breaking waveform data produced by a waveform producing means (not shown) into blocks in every 10 samples (this numeral "10" is indicated by hexadecimal number so that the numeral is "16", if it is indicated by decimal number), a binary difference processing means 14 for acquiring difference data from the waveform data broken into blocks by the blocking means 12, an exponent deciding means 16 for deciding an exponent common in the respective blocks, a re-difference processing means 18 for acquiring difference data based on the exponent decided by the exponent deciding means 16, a compression data producing and delivery means 20 for outputting compression data produced from the exponent and the difference data, and a block final data storing means 22 for storing final data quantized in a block (the quantization will be described in detail hereinafter) to supply the same to the binary difference processing means 14 for the next processing.

In the above construction, functions of the waveform data compression apparatus 10 will be described by referring to the flowchart shown in FIG. 5.

First, when waveform data to be compressed are inputted, the waveform data are broken into blocks by the blocking means 12 at step S502. More specifically, the waveform data for ten samples are stored, and the waveform data are broken into blocks in every ten samples, whereby an objective block to be processed is composed of ten samples. The data of ten samples broken into blocks are designated by from a(1) to a(10), respectively, wherein linear data a(i) (i: a hexadecimal number of from 1 to 10) is 16 bit data ("16" means decimal number). It is to be noted that the number of samples of waveform data to be broken into one block and the word length of sample data are not limited to those specified in this embodiment.

When the processing is completed at step S502, binary difference process is carried out by the binary difference processing means 14 at step S504 wherein the binary difference process means the following processing.

<Commencement of the Explanation for Binary Difference Process>

In the binary difference process, the final data quantized in the block immediately before the objective block to be processed is expressed by a(0), and it is used herein.

Data from b(1) to b(10) are determined by the following operations from the data from a(1) to a(10) and a(0). In this case, the order of the operations is not specified, but the operations may be carried out in accordance with an arbitrary order.

$$b(8) = a(8)$$
$$b(10) = a(10)$$
$$b(4) = a(4) - (a(0) + a(8))/2$$
$$b(c) = a(c) - (a(8) + a(10))/2$$
$$b(2) = a(2) - (a(0) + a(4))/2$$
$$b(6) = a(6) - (a(4) + a(8))/2$$
$$b(a) = a(a) - (a(8) + a(c))/2$$
$$b(e) = a(e) - (a(c) + a(10))/2$$
$$b(1) = a(1) - (a(0) + a(2))/2$$
$$b(3) = a(3) - (a(2) + a(4))/2$$
$$b(5) = a(5) - (a(4) + a(6))/2$$
$$b(7) = a(7) - (a(6) + a(8))/2$$
$$b(9) = a(9) - (a(8) + a(a))/2$$
$$b(b) = a(b) - (a(a) + a(c))/2$$
$$b(d) = a(d) - (a(c) + a(e))/2$$
$$b(f) = a(f) - (a(e) + a(10))/2$$

As described above, concerning the data b(8) and b(10) being the original data, they are used as a(8) and a(10) without any modification, respectively, and as to the other data, each of them is a difference obtained from arithmetic mean of the value at a sample point and another sample point apart from before and behind the former sample point by a prescribed sample numbers.

The processing manner for obtaining the data from b(1) to b(10) as described above is referred to as "binary difference process" in the present invention.

The calculating manner in the operations described above is an example so that, for instance, in order to determine "b(4)", the following calculation:

$$b(4) = a(4) - (a(0) + a(8))/2$$

may be effected as described above, or the following calculation:

$$b(4) = a(4) - \{(a(0)/2 + (a(8)/2)\}$$

may also be carried out, or further the following calculation:

b(4)=a(4)−(a(0)/2)−(a(8)/2)
may also be effected.

In this manner, the final data in the block (block final data) immediately before the objective block to be processed is the data a(0) as described above. In this case, for example, the following manners may be employed as to the determination of a(0) in the initial block.

In the first method, "0" or another constant is used as data for a(0).

Namely, in the case where a certain constant a is used, a certain constant: a

```
block 0: {a(1), a(2), . . . , a(f), a(10)}
block 1: {a(11), a(12), . . . , a(1f), a(20)}
block 2: {a(21), a(22), . . . , a(2f), a(30)}
       .       .
       .       .
``` are indicated as above. As indicated, a may be used for a(0) relating to the initial block.

Furthermore, in the second method, there is a manner involving only one preceding data. In this second method, all the blocks are divided behind with a shift by one data, so that preceding-data: a(1)

```
block 0: {a(2), a(3), . . . , a(10), a(11)}
block 1: {a(12), a(13), . . . , a(20), a(21)}
block 2: {a(22), a(23), . . . , a(30), a(31)}
       .       .
       .       .
``` are indicated. As indicated, the preceding data a(1) may be used for a(0) relating to the initial block.

As a matter of course, any method other than the above described first and second methods may suitably be employed.

<Completion of the Explanation for Binary Difference Process>

When completed the processing at step S504, the procedure proceeds to step S506 and exponents are decided by the exponent deciding means 16. More specifically, the data from b(1) to b(10) belonging to the same blocks obtained at step S504 are processed to represent the same by floating-points with the provision of exponents in every blocks for indicating the data from b(1) to b(10) with a shorter amount of data.

First, a common single exponent is decided in the blocks. In this case, the exponent is the number representing that the least bit of respective mantissa data d(i) outputted finally from the present waveform data compression apparatus 10 corresponds to which bit in the data b(i). In this case, however, it is to be noted that the least bit of the data b(i) is counted as the 0th bit.

In the present embodiment, a word length to be assigned to the data of respective addresses in the case when mantissa data are determined are as follows, respectively, otherwise specifically indicated (the mantissa data will be described hereinafter).

To be contained in 8 bit: Addresses 8, 10

To be contained in 6 bit: Addresses 4, c

To be contained in 4 bit: Addresses 2, 6, a, e

To be contained in 2 bit: Addresses 1, 3, 5, 7, 9, b, d, f

As described above, since bit lengths are different according to addresses, the following processing is made in the case when exponents are decided from b(i).

Respective minimal left-shift amounts applied to each b(i) in such that the upper two columns become "01" or "10" ("01" and "10" are binary numbers) are represented by s(i), respectively, and if b(i) is 0, s(i) is to be designated by f.

Among the following elements:.

| 10-8-s(i) | (i = 8, 10) |
|---|---|
| 10-6-s(i) | (i = 4, c) |
| 10-4-s(i) | (i = 2, 6, a, e) |
| 10-2-s(i) | (i = 1, 3, 5, 7, 9, b, d, f) | the maximal value is used as an exponent wherein the exponent is expressed by 4 bit.

<Commencement of the Explanation for Re-difference Process>

When completed the process at step S506 as described above, the procedure proceeds to step S508 at which the re-difference process is carried out.

While waveform data may be compressed on the basis of the fundamental principle of waveform data compression according to the present invention as mentioned hereinabove, when the re-difference process which will be described hereunder is conducted, errors accompanied with quantization can be remarkably reduced so that reproduction of extremely high qualitative waveform data can be expected in case of expansion of data.

In other words, at step S508, a reproduced value in case of expanding data is calculated by the re-difference processing means 18, and the value calculated is redifferentiated.

More specifically, the data b(8) and b(10) are quantized on the basis of the exponents decided at step S506, and the quantized data are designated by b⁻(8) and b⁻(10), respectively. The "quantization" at step S508 means such a manner that less bits are omitted by the amount corresponding to the exponent, and further number "1" is added to the uppermost bit of the omitted bits to round the value. In this process, the bit number is not reduced, but as to the discarded less bits, number "1" is filled in the uppermost place of the discarded portion, and "0" is filled in the much less places. Thus, for example, when an exponent is "7", "0" is filled in from 0th bit to 5th bit of:

f e d c b a 9 8 7 6 5 4 3 2 1 0 b(8)=0 0 1 0 1 1 0 0 1 0 1 1 0 1 1 1 (Each numeral in the upper row means that a certain bit is positioned at which place being apart how many number from the least bit, and the same shall apply hereinafter.)

whereas "1" is filled in the 6th bit. As a result, b⁻(8)=0 0 1 0 1 1 0 0 1 1 0 0 0 0 0 0 is obtained.

<Commencement of the Explanation for Rounding Process>

The rounding process in the present embodiment will be described in detail herein. Namely, when quantization is effected with an exponent N, "0" is filled in the data at (N−2)th bit and less, and (N−1)th bit is made to be "1".

For instance, when a value "176c" is quantized with exponent "4", "0" is filled in the data from 0th bit to 2nd bit, and 3rd bit is made to be "1", so that "1768" is obtained.

According to such rounding process, for example, when data are rounded with exponent "4", the following results are obtained.

| Interval | Quantized Data |
| --- | --- |
| 1 0 0 0 0 0–1 0 1 1 1 1 | 1 0 1 0 0 0 |
| 1 1 0 0 0 0–1 1 1 1 1 1 | 1 1 1 0 0 0 |
| 0 0 0 0 0 0–0 0 1 1 1 1 | 0 0 1 0 0 0 |
| 0 1 0 0 0 0–0 1 1 1 1 1 | 0 1 1 0 0 0 |

(The above table is indicated by binary number.)

Meanwhile, when only omission of data is carried out in case of rounding data, there is a merit of requiring no specific operation. However, errors accompanied with quantization become larger, while when only rounding (counting fractions of 0.5 and over as a whole number and disregarding the rest) is effected, errors accompanied with quantization are small, but addition including carrying is required, besides a countermeasure against overflow is required.

However, in the rounding process of the present embodiment described above, the manner is carried out in such that a certain column is made to be "1" and 0 is filled in the data thereunder. Thus, errors in quantization are equivalent to that of rounding, besides there is no carrying so that no addition is required. Furthermore, there is a characteristic of positive and negative symmetrical disposition of the data to be reproduced. It is to be noted that the rounding with exponent "0" means to effect no processing. <Completion of the Explanation for Rounding Process>.

In the meantime, the quantized data $b^-(8)$ and $b^-(10)$ correspond to the reproduced values $a^-(8)$ and $a^-(10)$ in case of expanding data without any modification.

The data a(0) used at step S502 is also obtained by quantizing the final sample data in the block immediately before the objective block to be processed in accordance with the exponent in the aforesaid block immediately before the objective block.

Under the circumstances, binary difference process is carried out by utilizing $a^-(8)$ and $a^-(10)$ in place of the data a(8) and a(10), and differences are again determined with respect to b(4) and b(c) by means of operation as described hereinbelow.

$b(4)=a(4)-(a(0)+a^-(8))/2$ $b(c)=a(c)-(a^-(8)+a^-(10))/2$

The data b(4) and b(c) thus obtained are quantized on the basis of the exponent to obtain $b^-(4)$ and $b^-(c)$ as quantized difference data.

<Commencement of the Explanation for Range Over>

Meanwhile, in the re-difference process at this step S508, since a value which is the base for difference changes from that of the binary difference process in step S504, there is not generally such a guarantee that the value changed is within a range of the exponent established at step S506.

For instance, it is assumed that a value is "7" (expressed by decimal number) in the binary difference process. This value including its sign may be expressed by 4 bit. (Up to from −8 to 7 (expressed by decimal number) can be expressed by 4 bit.) On the other hand, in the re-difference process, it is assumed that the value has been slightly changed into "9" (expressed by decimal number). In other words, there is a case where the re-difference data is not within a range of a prescribed word length, because of quantization error. This phenomenon is referred to as "range over of re-difference data due to quantization" in the present specification, and hereinafter it is referred to simply as "rang over".

In case of the above described example, it is necessary for a process for changing "9" (expressed by decimal number) into "7" (expressed by decimal number) in order to keep the value within a prescribed range. As described above, when a value exceeds the prescribed range as a result of re-difference process, such a process that the maximum number in the prescribed exponent range (a positive number in case of exceeding the established exponent) or the minimum number (a negative number in case of exceeding the established exponent) is given to the exceeded value is practiced. In other words, in case of range over, the nearest quantized value which can be expressed by a prescribed word length is used as the corresponding quantized value.

With respect to this range over, consideration will be made on, for example, the case where difference data of address c is quantized with exponent "4" into six bit. (A bit length of mantissa data has previously been established.)

As the original data, the following matters are used.

| Address | Data | Bit Length of Mantissa Data |
| --- | --- | --- |
| 8 | FFFF | 8 |
| c | 01FE | 6 |
| 10 | FFFF | 8 |

When a difference is determined by the above described address c, the result is as follows.

01FE−(FFFF+FFFF)/2=01FF

This value can be expressed in six bit with exponent "4". (The quantized value is 01F8.)

Thereafter, when quantization with exponent 4 is made, both the address "8" and the address "10" become FFF8 as a result of the quantization according to the above described rounding process. Furthermore, when the re-difference process is applied to the address c, the following result is obtained.

01FF−(FFF8+FFF8)/2=0206

This 0206 exceeds a range wherein the resulting value can be expressed in six bit with exponent "4".

Figure 6:
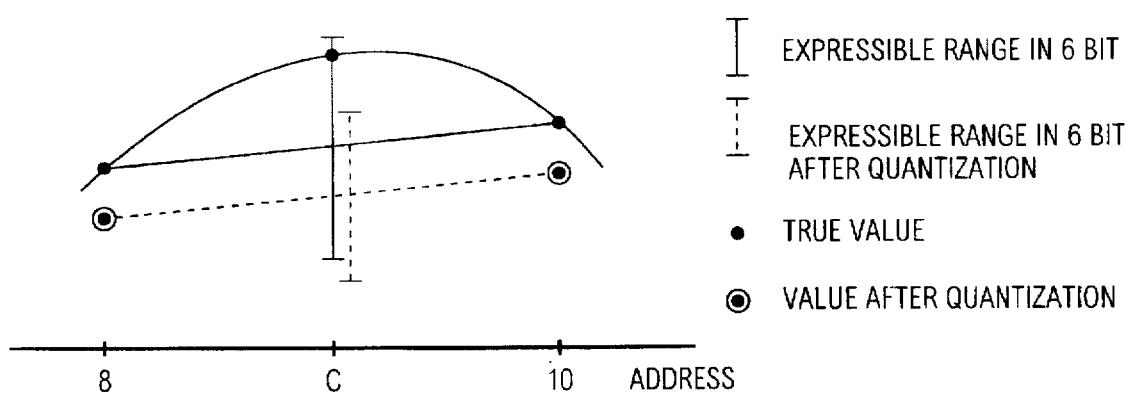
FIG. 6 is a graphical representation showing a state wherein an expressible range descends due to quantization so that the reproduced value in case of expanding data cannot reach the true value.

FIG. 6 is a graphical representation showing a state wherein an expressible range descends due to quantization, and as a result the reproduced value in case of expanding data cannot reach the true value.

The matter described above means range over of re-difference data due to quantization. In this case, the difference data quantized is altered to the nearest quantized value corresponding to exponent "4" and mantissa bit length "6", i.e. 01F8.

As mentioned above, it is required in the present embodiment to detect range over, and to modify the difference data quantized. <Completion of the Explanation for Range Over>

Then, $a^-(4)$ and $a^-(c)$ being the reproduced values in case of expanding the data are determined by the calculation as described hereinbelow.

$a^-(4)=b^-(4)+(a(0)+a^-(8))/2$ $a^-(c)=b^-(c)+(a(8)+a^-(10))/2$

<Commencement of the Explanation for Aliasing>

In the present embodiment, the reproduced value in case of expanding data exceeds a limit value for expression due to errors in quantization, so that extremely large errors arise, and such a phenomenon is referred to as "aliasing". Accordingly, when the aliasing occurs, it is necessary for modifying the quantized data with quantization unit so as not to exceed the limit value.

For example, an explanation will be made on the case where difference data of the address c are quantized with exponent "8", and in this case the original data are as follows.

| Address | Data | Bit Number of Mantissa Data |
|---|---|---|
| 8 | 7365 | 8 |
| c | 7FF2 | 6 |
| 10 | 7365 | 8 |

When binary difference is determined with respect to the address c, the result:

7FF2−(7365+7365)/2=0C8D is obtained. This is further amplified as follows.

| Address | Data | Value of Binary Difference |
|---|---|---|
| 8 | 7365 | |
| c | 7FF2 | 0C8D |
| 10 | 7365 | |

Then, the data are quantized with exponent "8", and the data 7365 is quantized into 7380 in accordance with rounding process in case of the above described quantization.

Moreover, when the address c is subjected to re-difference processing by employing the quantized value 7380, the following result is obtained.

7FF2−(7380+7380)/2=0C72

According to the rounding in case of the above described quantization, the re-difference value 0C72 is quantized into 0C80.

As a result, a reproduced value of the address c in case of expanding the data is as follows.

(7380+7380)/2+0C80=8000

Namely, this means that the number 7FF2 being close to the maximum number in 16 bit expression is reproduced into the number 8000 being the minimum number in 16 bit expression. As a result, there arises "aliasing" which brings about extremely large errors.

In order to prevent from occurring such aliasing, when the re-difference value 0C72 is quantized into 0C80 in accordance with the rounding process in case of the quantization, the value is altered by a quantized unit, i.e. C is altered to B, and 0C80 is altered to 0B80.

As a result of the above alteration, a reproduced value of the address c in case of expanding the data is as follows, (7380+7380)/2+0B80=7F00 so that occurrence of aliasing can be prevented.

Accordingly, when quantized data are produced, occurrence of such aliasing is detected, and the resulting value is modified with the quantization unit as described above. <Completion of the Explanation for Aliasing>

Furthermore, based on the data a(0), a⁻(4), a⁻(8), a⁻(c), and a⁻(10), difference data b(2), b(6), b(a), and b(e) are determined in accordance with the following calculations.

$$b(2) = a(2) − (a(0) + a^-(4))/2$$
$$b(6) = a(6) − (a^-(4) + a^-(8))/2$$
$$b(a) = a(a) − (a^-(8) + a^-(c))/2$$
$$b(e) = a(e) − (a^-(c) + a^-(10))/2$$

Still further, these data are quantized with exponents to determine quantized difference data b⁻(2), b⁻(6), b⁻(a), and b⁻(e), and the corresponding reproduced values are determined in accordance with the following calculations.

$$a^-(2) = b^-(2) + (a(0) + a^-(4))/2$$
$$a^-(6) = b^-(6) + (a^-(4) + a^-(8))/2$$
$$a^-(a) = b^-(a) + (a^-(8) + a^-(c))/2$$
$$a^-(e) = b^-(e) + (a^-(c) + a^-(10))/2$$

The difference data of odd number addresses are again calculated by employing the reproduced values determined as described above hereinbelow.

$$b(1) = a(1) − (a(0) + a^-(2))/2$$
$$b(3) = a(3) − (a^-(2) + a^-(4))/2$$
$$b(5) = a(5) − (a^-(4) + a^-(6))/2$$
$$b(7) = a(7) − (a^-(6) + a^-(8))/2$$
$$b(9) = a(9) − (a^-(8) + a^-(a))/2$$
$$b(b) = a(b) − (a^-(a) + a^-(c))/2$$
$$b(d) = a(d) − (a^-(c) + a^-(e))/2$$
$$b(f) = a(f) − (a^-(e) + a^-(10))/2$$

Moreover, the resulting data are quantized in accordance with exponents as in the manner described above to obtain the data from b⁻(1) to b⁻(f).

From the respective quantized data b⁻(i), further data are extracted in accordance with values of exponent and the above prescribed word length to obtain d(i).

The data extracted in this case is a section corresponding to the word length counting from the exponent's column wherein the least column of b⁻(i) is counted as 0th column. For example, if "exponent=7" as exemplified in the above description, the data:

f e d c b a 9 8 7 6 5 4 3 2 1 0
b(8) = 0 0 1 0 1 1 0 0 1 0 1 1 0 1 1 1 (expressed by binary number)

is quantized to obtain the following result.

b⁻(8) = 0 0 1 0 1 1 0 0 1 1 0 0 0 0 0 0 (expressed by binary number)

Accordingly, when the data is extracted so as to correspond to "the word length=8 bit" from "the exponent column=7th column", the following result is obtained.

d(8)=0 1 0 1 1 0 0 1 (expressed by binary number)

The similar process is applied to the respective b⁻(i) to determine the respective d(i). These respective data d(i) are mantissa data with respect to exponents.

The re-difference process is not limited to the above described manner, but it may be applied in accordance with the undermentioned manner.

Namely, the re-difference result of the address c obtained by the re-difference process at step S508 in the above description (the re-difference result of the address c is defined as "b_(c)",and the explanation will be made according thereto.) is as follows.

$$b\_(c) = a(c) − (a^-(8) + a^-(10))/2 \qquad \text{Equation 1}$$

When the difference result of the address c obtained by the normal binary difference process at step S504, i.e.:

$$b(c) = a(c) − (a(8) + a(10))/2 \qquad \text{Equation 2}$$

is modified in accordance with the following manner, the same result as that of Equation 1 can be obtained.

Namely, if a quantization error with respect to a(i) is e(i), it may be expressed by the following equation.

$$e(i)=a^-(i)-a(i) \quad \text{Equation 3}$$

In this connection, even if the following calculation:

$$b\_(c)=b(c)-(e(8)+e(10))/2 \quad \text{Equation 4}$$

is made, the same value as that of Equation 1 can be obtained. Thus, this means that a similar re-difference process to that of the re-difference process at the above described step S508 has been made.

From the following calculations:

$$\begin{aligned} b\_(c) &= b(c) - (e(8) + e(10))/2 \\ &= a(c) - (a(8) + a(10))/2 - (a^-(8) - a(8) + a^-(10) - a(10))/2 \\ &= a(c) - (a^-(8) + a^-(10))/2 \end{aligned}$$

(the right side of Equation 1)

it is understood that the result of Equation 1 equals that of Equation 4.

A variety of manners may be employed as the procedure for calculating re-difference process as described above. <Completion of the Explanation for Re-difference Process>.

Figures 7, 8:
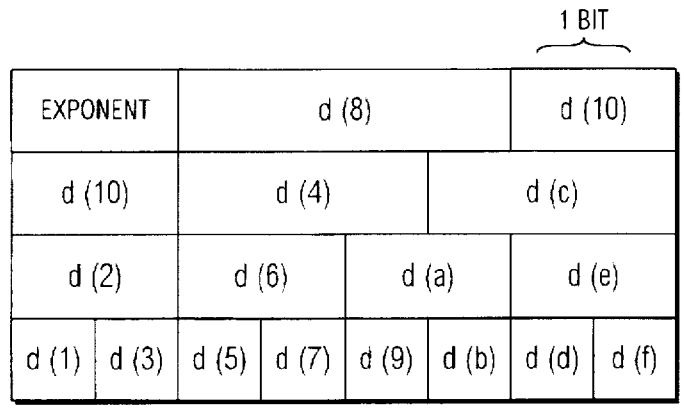
FIG. 7 is an explanatory diagram showing an example of the formation of compression data.
FIG. 8 is a diagram showing a typical example required for a mean square error reducing method.

When completed the process at step S508, the procedure proceeds to step S510 wherein the exponents and the mantissa data from d(1) to d(10) are disposed on the isometric data as shown, for example, in FIG. 7 to prepare compression data corresponding to one block, the compression data is delivered to a storage means such as a memory and the like to store the data therein, at the same time, the data $a^-(10)$ is stored in the block final data storing means 22 as a fresh data a(0) with making provisions for the processing of the following block, the procedure returns to step S502, and the above described process is repeated. In the case where a preceding data is used as the data a(0) with respect to the first block, the preceding data is delivered prior to the compression data without any modification.

<Explanation of Method for Reducing Mean Square Errors>

It is desirable to reduce a mean square of the quantization errors in case of the above described step S506 wherein exponents are decided and the step S508 wherein data are quantized. In the process at the step S506, an exponent is decided as the minimum number being the one by which up to the uppermost place of significant figures in respective difference data can be expressed by a prescribed word length. There is, however, a case where the whole mean square errors can be reduced according to circumstances, when an exponent is made smaller by "1". Such a manner as described herein is referred to as "method for reducing mean square errors".

In FIG. 8, a typical example required for method of reducing mean square errors. More specifically, exponent "4" comes to be adopted in the process of the above described step S506 in case of the difference values shown in FIG. 8 (only the address "8" is a linear data). In fact, 6 bit is required for the data of address "1" including the sign thereof. Quantized values with exponent "4" are as indicated in the "quantized value 1" (wherein errors are indicated by only absolute value).

On one hand, when data are quantized with exponent "3" which is smaller by "1" than exponent "4", the results are as indicated in the "quantized value 2". As a result, the data of address "1" become range-over so that the quantization errors increase. There is, however, such a tendency that errors in the other data decrease, so that the sum square of errors in the whole blocks decrease finally.

In the case where such method for reducing mean square errors as described above is employed, the method may be applied in such that the sum square in the quantization errors with the exponent obtained in the process at the above described step S506 is compared with the sum square in the quantization errors with the exponent which is smaller by "1" than that of the step S506, so that the quantized value and the exponent which correspond to the smaller sum square are adopted.

Figure 5:
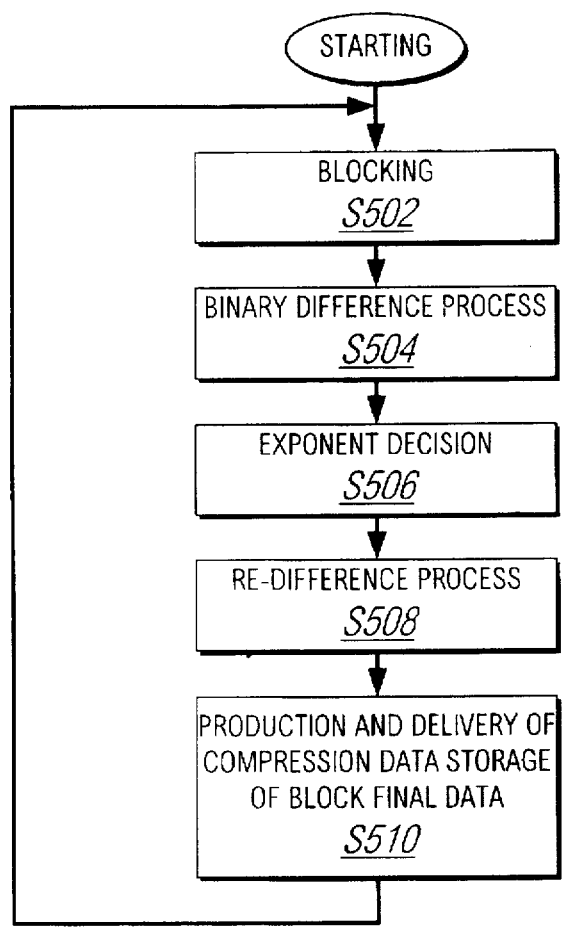
FIG. 5 is a flowchart showing functions of the waveform data compression apparatus shown in FIG. 4.
Figure 9:
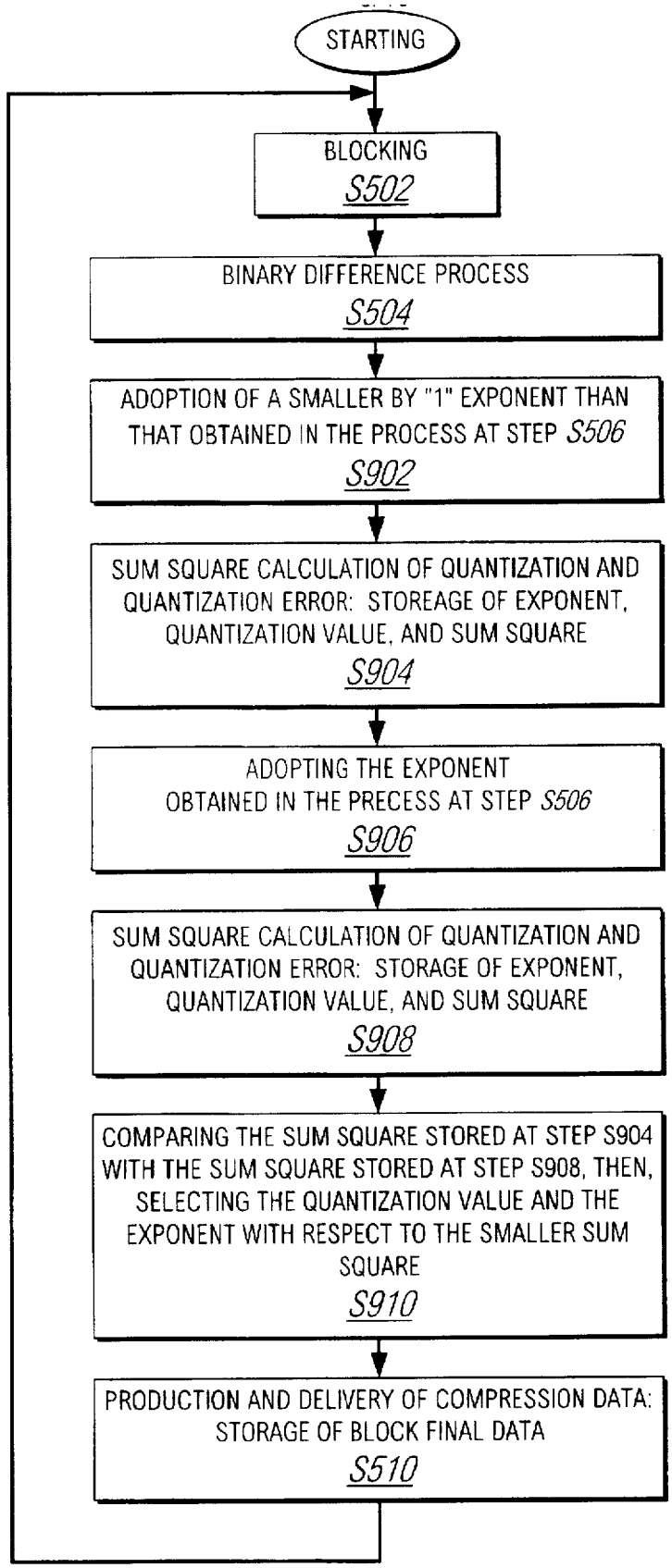
FIG. 9 is a flowchart corresponding to the flowchart of FIG. 5 and showing a flow of the processing according to the first embodiment in which the mean square error reducing method is used.

FIG. 9 is a flowchart showing a flow of the process according to an embodiment wherein the method for reducing mean square errors and which corresponds to the flowchart of FIG. 5. In FIG. 9, the same processing contents as those of FIG. 5 are designated by the same step numbers as that of FIG. 5, and the detailed descriptions therefor are omitted.

In the embodiment shown in FIG. 9, when the processing at steps S502 and S504 is completed, an exponent being smaller by "1" than that obtained in the process at the above described step S506 is adopted (step S902), data is quantized with the exponent thus obtained to determine a sum square of the quantization errors, and then the exponent adopted in the quantization, the quantized value, and the sum square are stored (step S904).

Then, the exponent obtained in the process at the above described step S506 is adopted (step S906), data is quantized with the thus obtained exponent to determine a sum square of the quantization errors', and the exponent used in the quantization, the quantized value, and the sum square are stored (step S908).

Thereafter, the procedure proceeds to step S910, and the following procedure may be carried out in such that the sum square in the quantization errors stored in the step S904 is compared with the sum square in the quantization errors stored in the step S908, so that the quantized value and the exponent are selected with respect to the smaller sum square.

As a matter of course, the order for applying the process wherein data is quantized by adopting a smaller exponent by "1" than that obtained in the process at step S506 to determine a sum square in the quantization errors (steps S902 and S904) and the process wherein data is quantized by using the exponent obtained in the process at step S506 to determine a sum square in the quantization errors (steps S906 and S908) may suitably be replaced. <Completion of the Explanation for Method of Reducing Mean Square Errors> [Completion of the Explanation for Waveform Data Compression Apparatus].

[Commencement of the Explanation for Waveform Data Expansion Apparatus]

Next, a waveform data expansion apparatus for expanding the compression data produced by the waveform data compression apparatus according to the above described embodiment of the present invention will be described hereinbelow.

Figure 10:
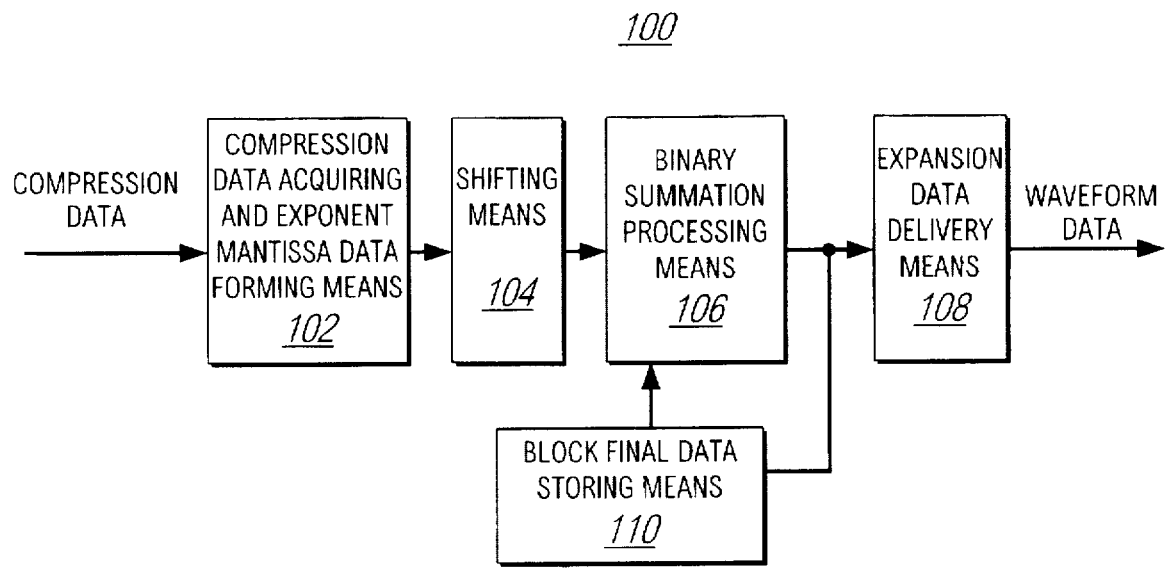
FIG. 10 is a block diagram showing the waveform data expansion apparatus according to an embodiment of the present invention.

FIG. 10 is a block diagram showing a waveform data expansion apparatus according to an embodiment of the present invention wherein the whole operations of the waveform data expansion apparatus are controlled by microcomputers.

The waveform data expansion apparatus 100 comprises a compression data acquiring and exponent-mantissa data forming means 102 which acquires the compression data produced by the above described waveform data compression apparatus 10 in every blocks, and also forms exponents and mantissa data from d(1) to d(10), a shifting means 104 for shifting the aforesaid mantissa data from d(1) to d(10) in response to exponents, a binary summation processing means 106 for effecting binary summation process based on the data shifted by the shifting means 104, an expansion data delivery means 108 for delivering waveform data being the expansion data reproduced by the binary summation processing means 106 to an external device and the like wherein the waveform data are used, and a block final data storing means 110 for storing the block final data in data delivered from the expansion data delivering means 108 for the next processing thereby to supplying the same to the binary summation processing means 106.

In the above construction, functions of the waveform data expansion apparatus 100 will be described hereunder by referring to the flowchart of FIG. 11.

First, when compression data are inputted, the objective data to be processed corresponding to one block which are composed of exponents and the mantissa data from d(1) to d(10) are acquired from the compression data inputted by the compression data acquiring and mantissa-exponent data forming means 102 at step S1402.

In this case, magnitudes of the exponents and the mantissa data from d(1) to d(10) are expressed as follows.
Exponent: 4 bit data ("4" is a decimal number)
d(8), d(10): 8 bit data ("8" is a decimal number)
d(4), d(c): 6 bit data ("6" is a decimal number)
d(2), d(6), d(a), d(e): 4 bit data ("4" is a decimal number)
d(1), d(3), d(6), d(7), d(9), d(b), d(d), d(f): 2 bit data ("2" is a decimal number)

When completed the processing at step S1402, the procedure proceeds to step S1404 wherein the mantissa data d(i) corresponding to one block which were acquired at step S1402 are shifted by the number indicated by its exponent by means of the shifting means 104, whereby "1" is added to the uppermost bit in the bits which have been discarded at the time of the compression to reproduce a value (rounding), and further a sign bit (the uppermost bit) is filled in an upper place, i.e. a so-called sign expansion is effected to produce data b(i) being 16 bit data ("16" is expressed by decimal number).

When completed the processing at step S1404, the procedure proceeds to step S1406 wherein a binary summation process is carried out by the binary summation processing means 106. Herein, the term "binary summation process" means to conduct the following processing.

<Commencement of the Explanation for Binary Summation Process>

In the binary summation process, the final data after reproducing the block immediately before the objective data to be processed (block final data) is expressed by a(0). This a(0) is a 16 bit data ("16" is a decimal number), and data from a(1) to a(10) are reproduced by the following manner.

First, data b(8) and b(10) are expressed by data a(8) and a(10) without any modification. That is:

a(10)=b(10)
a(8)=b(8)

Then, data a(4) and a(c) are produced from the data a(0), a(8), and a(10) as a result of the following operations.

a(4)=b(4)+(a(0)+a(8))/2 a(c)=b(c)+(a(8)+a(10))/2

Furthermore, data a(2), a(6), a(a), and a(e) are produced from the values obtained in the above described operations in accordance with the following operations.

| |
|---|
| a(2) = b(2) + (a(0) + a(4))/2 |
| a(6) = b(6) + (a(4) + a(8))/2 |
| a(a) = b(a) + (a(8) + a(c))/2 |
| a(e) = b(e) + (a(c) + a(10))/2 |

Thereafter, the following operations are conducted based on the values obtained as described above to produce data a(1), a(3), a(5), a(7), a(9), a(b), a(d), and a(f) in the same way.

| |
|---|
| a(1) = b(1) + (a(0) + a(2))/2 |
| a(3) = b(3) + (a(2) + a(4))/2 |
| a(5) = b(5) + (a(4) + a(6))/2 |
| a(7) = b(7) + (a(6) + a(8))/2 |
| a(9) = b(9) + (a(8) + a(a))/2 |
| a(b) = b(b) + (a(a) + a(c))/2 |
| a(d) = b(d) + (a(c) + a(e))/2 |
| a(f) = b(f) + (a(e) + a(10))/2 |

The process for finding the data from a(1) to a(10) as expansion data is referred to as "binary summation process" in the present invention. <Completion of the Explanation for Binary Summation Process>.

When completed the process at step S1406, the procedure proceeds to step S1408 wherein the expanded data a(i) produced at step S1406 as a reproduced waveform data is delivered to an external device and the like in which the waveform data is used by the expansion data delivery means, at the same time, the data a(10) is stored as a new data a(0) in the block final data storage means 110 for preparing processing of the following block, then the procedure returns to the step S1402, and repeats the above described processes. It is to be noted that as to the data a(0), when a constant a was used as a(0) in respect of the initial block at the time of compression, the aforesaid constant a is to be employed, while when a preceding data was used as a(0) with respect to the initial block, the preceding data inputted prior to the compression data is to be employed without any modification. [Completion of the Explanation for Waveform Data Expansion Apparatus]

[Commencement of the Explanation for Embodiment by Multi-point Interpolation]

In the waveform data compression apparatus and the waveform data expansion apparatus according to the above described embodiments, when the difference data of a certain address is obtained, a difference between a two-point mean value which is obtained from both the points before and behind the certain address in question and the very certain address has been taken out. In other words, this is a linear interpolation between two points, and when this method is compared with a conventional manner in which waveform data are expressed by linear data or a manner in which a difference is taken out from the objective data to be processed and the one immediately before the objective data, a magnitude of the data can be reduced in the former method, so that the precision thereof can be elevated in the case where data are contained in the same word length.

In the present invention, however, the interpolation is not limited to the two-point linear interpolation in the above described embodiments, but three-, four- or more, i.e. multi-point interpolation may be practiced, so that a difference is determined from a value obtained among these multiple points and that of the objective data, whereby a magnitude of the data may be made smaller than that in the above described embodiments.

Furthermore, in the above described embodiments according to two-point interpolation, since the compression data d(1) of address "1" is to be contained, for example, in two bit word length, its exponent is decided by the data of address "1" in the case where a magnitude of b(1) before compression is somewhat higher level of data, in comparison with other data, with respect to storage bit length. In this case, other word length data must be adapted for the exponent, so that there may be a case where upper bits in the compression data of other word lengths become redundant bits.

In this respect, however, when three-, four- or more, i.e. multi-point interpolation is practiced, such data which can be contained sufficiently in short word lengths are obtained. Accordingly, there is also an advantage of overcoming the above described defect.

An embodiment of the present invention wherein multi-point interpolation is practiced will be described hereinbelow. The explanation is made on the case where a difference is obtained by three- or four-point interpolation with respect to only the data of odd number addresses, while concerning even number addresses, the explanation is made on the same case with that of two-point interpolation.

As a result of inventors' experiments with respect to a variety of input signals, it has been found that there is such a tendency that in two-point interpolation, a magnitude of the data in odd number addresses is somewhat larger than that of the other data with respect to storage bit length. Thus, when three- or four-point interpolation is applied on odd number addresses, a good balance is kept with the other data in respect of storage bit length. As a matter of course, the interpolation is not limited to the three- or four-point interpolation, but a larger number-point interpolation may be applied in the present embodiment. The larger number-point interpolation makes possible to obtain the smaller magnitude of difference data, so that when the resulting data are contained in the same word length, a better precision can be obtained. On one hand, multi-point interpolation may be applied to not only odd number addresses, but also even number addresses. In this respect, however, when three- or four-point interpolation is applied to only odd number addresses, sufficient data compression can be practically attained without accompanying not so much increase in the throughput.

<Commencement of the Explanation for Waveform Data Compression Apparatus Based on Multi-point Interpolation>

Figure 12:
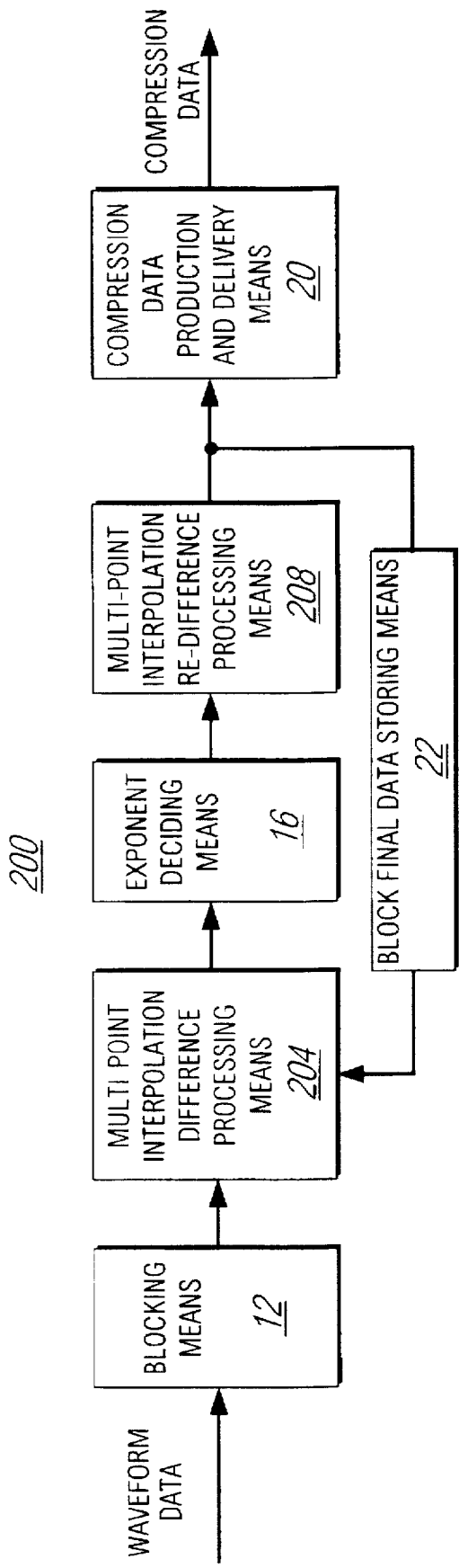
FIG. 12 is a block diagram illustrating a modified embodiment of the waveform data compression apparatus.
Figure 13:
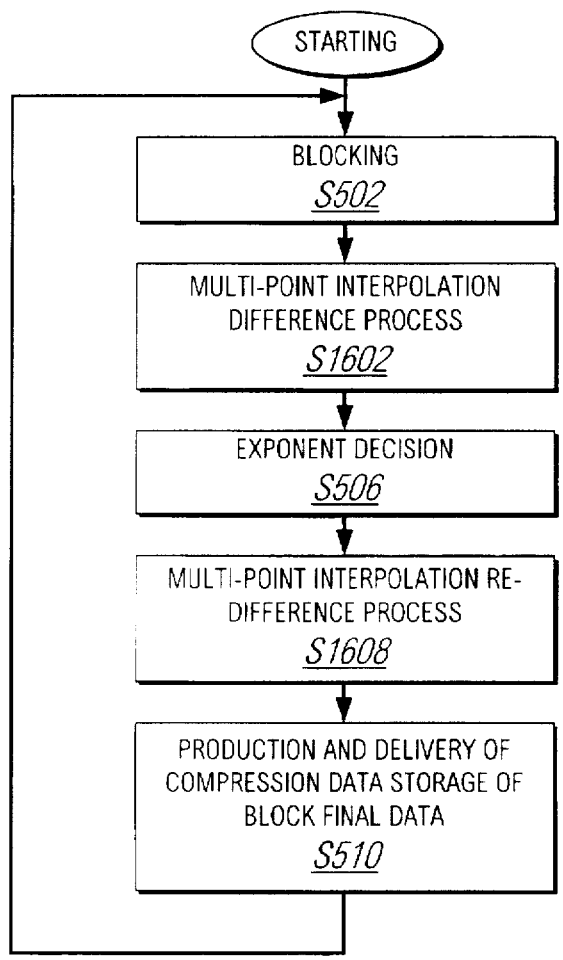
FIG. 13 is a flowchart showing functions of the waveform data compression apparatus shown in FIG. 12.

First, a waveform data compression apparatus will be described hereunder by referring to FIGS. 12 and 13 wherein the same component means and processing contents with those of the waveform data compression apparatus 10 shown in FIGS. 4 and 5 are designated by the same reference numerals and step numbers with those of FIGS. 4 and 5, so that the detailed explanation therefor will be omitted.

The present embodiment differs from the foregoing embodiments in such points that multi-point interpolation difference process is carried out by a multi-point interpolation difference processing means 204 at step S1602, and that multi-point interpolation re-difference process is effected by a multi-point interpolation re-difference processing means 208 at step S1608.

In the multi-point interpolation difference process, first, a final block data in the block immediately before the objective block to be processed is expressed by a(0), and then data from b(1) to b(10) are determined as follows.

$$b(8) = a(8)$$
$$b(10) = a(10)$$
$$b(4) = a(4) - (a(0) + a(8))/2$$
$$b(c) = a(c) - (a(8) + a(10))/2$$
$$b(2) = a(2) - (a(0) + a(4))/2$$
$$b(6) = a(6) - (a(4) + a(8))/2$$
$$b(a) = a(a) - (a(8) + a(c))/2$$
$$b(e) = a(e) - (a(c) + a(10))/2$$
$$b(1) = a(1) - (3*a(0) + 6*a(2) - a(4))/8$$
$$b(3) = a(3) - (-a(0) + 9*a(2) + 9*a(4) - a(6))/16$$
$$b(5) = a(5) - (-a(2) + 9*a(4) + 9*a(6) - a(8))/16$$
$$b(7) = a(7) - (-a(4) + 9*a(6) + 9*a(8) - a(a))/16$$
$$b(9) = a(9) - (-a(6) + 9*a(8) + 9*a(a) - a(c))/16$$
$$b(b) = a(b) - (-a(8) + 9*a(a) + 9*a(c) - a(e))/16$$
$$b(d) = a(d) - (-a(a) + 9*a(c) + 9*a(e) - a(10))/16$$
$$b(f) = a(f) - (-a(c) + 6*a(e) + 3*a(10))/8$$

In the above description, three-point interpolation is applied to the data b(1) and b(f), whereas four-point interpolation is applied to the data b(3), b(5), b(7), b(9), b(b), and b(d). However, four-point interpolation may be applied also to the data b(1) and b(f) by employing the data in the preceding block as well as the data in the succeeding block to the objective block to be processed.

More specifically, concerning the data b(1), data a__(e) of the address e in the block prior to the objective block to be processed is used, and the following operation may be made.

$$b(1)=a(1)-(-a\_(e)+9*a(0)+9*a(2)-a(4))/16$$

Furthermore, concerning the data b(f), data a^(2) of the address "2" in the block succeeding to the objective block to be processed is used, and the following operation may be made.

$$b(f)=a(f)-(-a(c)+9*a(e)+9*a(10)-a^{\wedge}(2))/16$$

However, in the case where the data in the block succeeding to the objective block to be processed is employed as described above, the process is carried out after the data in the succeeding block were acquired so that delivery of data from the waveform data compression apparatus delays as compared with that of data in the case where the data in the succeeding block is not employed. In case of the initial block, the same value as that of a(0) may be used as a__(e) in the above described process, while in case of the final block, a(10) may be used as a^(2) in the above described process.

It is to be noted that the coefficients (⅜, ⅝, −⅛) in case of the above described data b(1), and b(f) as well as the coefficients (−1/16, 9/16, 9/16, −1/16) in case of the data b(3), b(5), b(7), b(9), b(b), and b(d) are coefficients of spline interpolation.

To determine interpolation coefficient, it is not only one method in which spline is used, but there are various methods such as a method in which integral values of frequency characteristics are minimized, a method in which a statistical manner is employed, and the like method.

<Commencement of the Explanation for Determining Spline Coefficients>

A method for determining spline coefficients in four-point interpolation and three-point interpolation will be described. Namely, an arbitrary spline can be expressed by a linear combination of values of respective nodes and cardinal splines. In case of the four-point interpolation, when specified values at the four points are expressed by $A_0$, $A_1$, $A_2$, and $A_3$ as well as when cardinal splines corresponding to the respective points are expressed by $C_0(x)$, $C_1(x)$, $C_2(x)$, and $C_3(x)$, respectively, the following equation is obtained.

$$f(X)=A_0*C_0(x)+A_1*C_1(x)+A_2*C_2(x)+A_3*C_3(x)$$

Accordingly, the value at a certain point X is expressed by a linear combination of the respective $C_i(X)$ and $A_i$ wherein the spline coefficient is $C_i(X)$. In case of the three-point interpolation, the same explanation as that of the four-point interpolation can be applied. The above described coefficients (such as $-1/16$, $9/16$, $9/16$, $-1/16$ and the like) correspond to the cases wherein natural splines are used. <Completion of the Explanation for Determining Spline Coefficients>.

Furthermore, in the multi-point interpolation re-difference process, when a difference is obtained again while calculating a reproduced value at the time of expanding data based on the same interpolating method as that of the above described multi-point interpolation difference process, errors accompanied with quantization can significantly be reduced as in the case of two-point interpolation. <Completion of the Explanation for Waveform Data Compression Apparatus According to Multi-point Interpolation>.

<Commencement of the Explanation for Waveform Data Expansion Apparatus According to Multi-point Interpolation>

Figure 11:
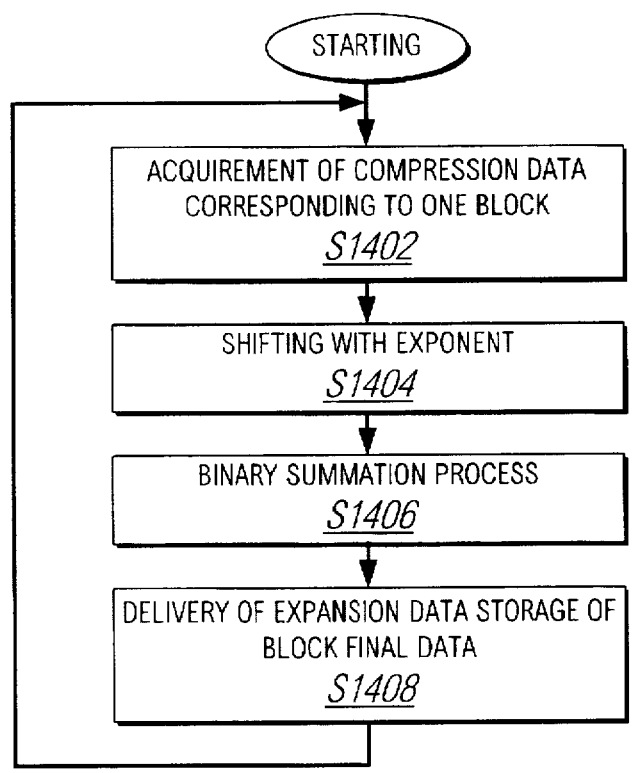
FIG. 11 is a flowchart showing functions of the waveform data expansion apparatus shown in FIG. 10.
Figure 14:
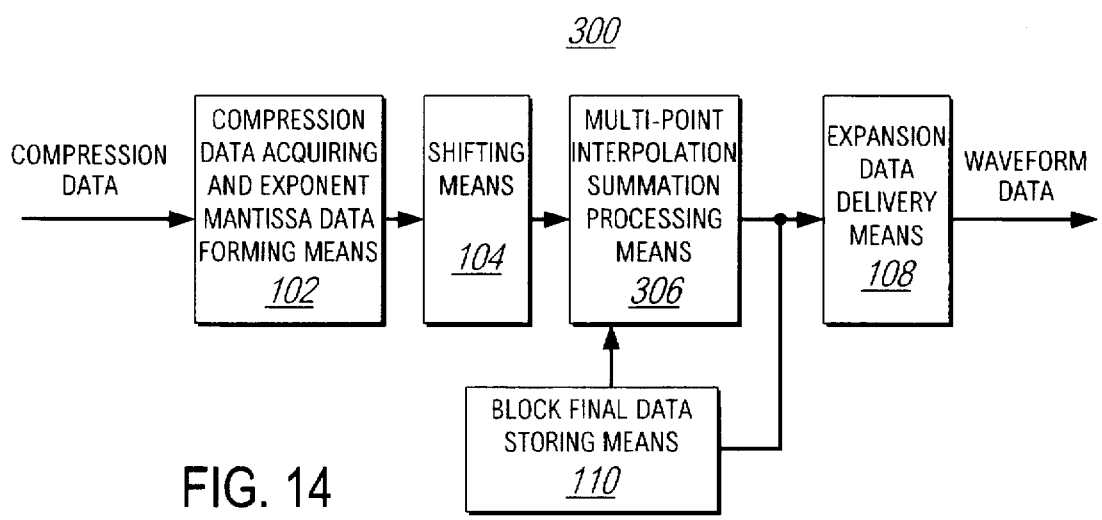
FIG. 14 is a block diagram illustrating a modified embodiment of the waveform data expansion apparatus.

Next, a waveform data expansion apparatus according to multi-point interpolation which expands the compression data produced by the waveform data compression apparatus according to multi-point interpolation which was explained by referring to FIGS. 12 and 13 will be described hereinbelow in conjunction with FIGS. 14 and 15 wherein the same component means and processing contents with those of the waveform data compression apparatus 100 shown in FIGS. 10 and 11 are designated by the same reference numerals and step numbers with those of FIGS. 10 and 11, so that the detailed explanation therefor will be omitted.

Namely, in the waveform data expansion apparatus 300, the present embodiment differs from the above described embodiments in that multi-point interpolation sum process is carried out by a multi-point interpolation sum processing means 306 at step S1802.

In the multi-point interpolation sum process, a reproduced final value in the block immediately before the objective block is expressed by a(0). The data a(0) is a 16 bit data ("16" is a decimal number).

Data from a(1) to a(10) are reproduced as follows.

First, data b(8) and b(10) are expressed by the data a(8) and a(10) without any modification.

a(10)=b(10)

a(8)=b(8)

Then, data a(4) and a(c) are determined from the data a(0),.. a(8), and a(10) by the following operations.

a(4)=b(4)+(a(0)+a(8))/2 a(c)=b(c)+(a(8)+a(10))/2

Furthermore, data a(2), a(6), a(a), and a(e) are obtained in accordance with the following operations.

$$a(2) = b(2) + (a(0) + a(4))/2$$
$$a(6) = b(6) + (a(4) + a(8))/2$$
$$a(a) = b(a) + (a(8) + a(c))/2$$
$$a(e) = b(e) + (a(c) + a(10))/2$$

Finally, data a(1), a(3), a(5), a(7), a(9), a(b), a(d), and a(f) are determined by the operations as follows.

$$a(1) = b(1) + (3*a(0) + 6*a(2) - a(4))/8$$
$$a(3) = b(3) + (-a(0) + 9*a(2) + 9*a(4) - a(6))/16$$
$$a(5) = b(5) + (-a(2) + 9*a(4) + 9*a(6) - a(8))/16$$
$$a(7) = b(7) + (-a(4) + 9*a(6) + 9*a(8) - a(a))/16$$
$$a(9) = b(9) + (-a(6) + 9*a(8) + 9*a(a) - a(c))/16$$
$$a(b) = b(b) + (-a(8) + 9*a(a) + 9*a(c) - a(e))/16$$
$$a(d) = b(d) + (-a(a) + 9*a(c) + 9*a(e) - a(10))/16$$
$$a(f) = b(f) + (-a(c) + 6*a(e) + 3*a(10))/8$$

wherein coefficients ($3/8$, $6/8$, and $-1/8$) of the data a(1) and a(f) as well as coefficients ($-1/16$, $9/1$, $9/16$, and $-1/16$) of the data a(3), a(5), a(7), a(9), a(b), and a(d) are spline coefficients as described above..

Moreover, the process according to the above described two-point interpolation may be combined with the process of the above described multi-point interpolation, if necessary. <Completion of the Explanation for Waveform Data Expansion Apparatus According to Multi-point Interpolation> [Completion of the Explanation for the Embodiment According to Multi-point Interpolation].

[Commencement of the Explanation for Pattern Codes]

A method for allocating mantissa word length which has been described hereinabove is a fixed manner for allocating word lengths with respect to mantissa of respective addresses, besides only address "8" (16) was a linear data. However, adaptability with respect to waveforms can be elevated by changing word length allocation with respect to the respective addresses, or making even data of the addresses other than the address "8" (16) to be linear data dependent upon a magnitude of the data to be expressed.

In the following examples, an exponential part of the compression data produced is not used as a code for expressing simply an exponent, but a code for expressing attributes of the respective data (which indicate that data is either linear data or difference data) and for expressing a pattern of mantissa word length allocation in addition to the expression of the exponent. For instance, when codes for expressing exponents, attributes of data, and patterns of mantissa word length allocation are separately prepared, realizable combinations are limited as to the combination of these factors in their number, besides they are expressed by redundant codes as a whole. In this respect, when such codes indicating only these realizable combinations are prepared, efficient expressions become possible. Thus, when such codes as described above are employed in place of exponents, these codes are referred to as "pattern codes" in the present specification. The "pattern code" will be described in detail hereinbelow.

<Commencement of the Explanation for Those Expressed by Pattern Codes>.

A pattern code indicates:

(1) An exponent, i.e. a shift amount (2) An attribute in every addresses of respective mantissa part data in blocks, i.e. a distinction wherein the data are either linear data or difference data (3) A mantissa word length in every addresses of respective mantissa part data in blocks <Completion of the Explanation for Those Expressed by Pattern Codes>.

<Commencement of the Explanation for the First Example of Pattern Codes>

Figures 15, 16:
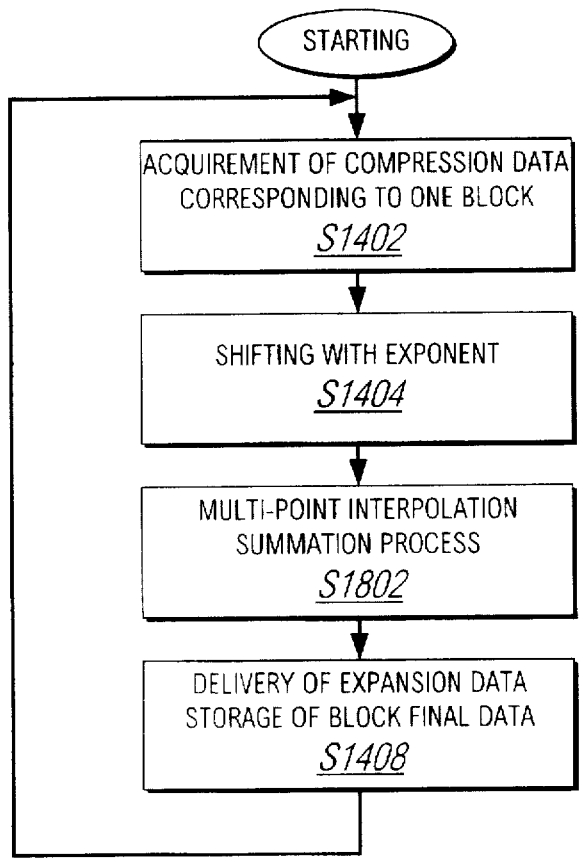
FIG. 15 is a flowchart showing functions of the waveform data expansion apparatus shown in FIG. 14.
FIG. 16 is a diagram showing the first example of pattern codes.

In FIG. 16, the first example of pattern codes is shown. The example of FIG. 16 indicates mantissa word length in every addresses at eight data/block wherein data with "L" means linear data, and the others are difference data.

In this case, the difference data are those obtained by the above described binary difference process.

As shown in FIG. 16, a length of a pattern code is not specified, but it is arranged in such that a head portion of any code having any length does not coincide with that of the other codes.

In order to keep an amount of compression data in every blocks constant, when the sum total of bit lengths of a mantissa part data is added to the bit length of a pattern code itself, the resulting value is 20 bit in any case. According to this arrangement, a data amount in every blocks becomes constant, so that the handling thereof becomes also easy.

Dependent upon an exponent, a plurality of pattern codes are allowed to correspond thereto. In other words, a plurality of pattern codes which afford different bit allocation to the same exponent are prepared to elevate adaptability with respect to waveform. For example, in an aural signal containing less higher harmonics, there is a case where a wider storage region is intended to assign to linear data. In the example shown in FIG. 16, 9 bit is assigned to linear data in response to pattern codes "010", "011", and "100".

As mentioned above, since pattern code indicates simultaneously an exponent with a mantissa word length allocation pattern, the expression thereof is less redundant than the case where codes are assigned separately to the exponent and the mantissa word length allocation, so that the former case is more efficient. Furthermore, there is also such a merit of setting easily and freely a word length of respective pattern codes. For instance, in FIG. 16, pattern codes having exponent of "5" are two types of pattern codes "010" and "1010". In this connection, if a code expressing mantissa word length allocation pattern by 1 bit is separately prepared, the pattern code is formed from a part indicating the exponent "5" and 1 bit expressing the mantissa word length allocation pattern. At this point in time, there is such a restriction that at least word lengths of both the pattern codes must be equalized. Accordingly, when an exponent is indicated simultaneously with a mantissa word length allocation pattern, code patterns can freely be set.

As a result, adjustment of word lengths of pattern code can easily be effected so that regarding two patterns having different sum totals of mantissa word lengths, it is possible to equalize a sum obtained by adding a pattern cord word length to mantissa word lengths of either pattern to that of the other pattern.

On the other hand, there is no problem in an exponent appearing at a low frequency without provision of a pattern code. In the example shown in FIG. 16, there is no pattern code expressing exponent "1", while the reason why a pattern code is assigned to exponent "0" is for consideration of handling of data in case of silence.

As a matter of course, one linear data is inevitably required in every blocks.

Furthermore, the sum of respective mantissa word lengths is limited in such that the sum of an exponent and the respective mantissa word lengths come to be "10 (hexadecimal number)" at the maximum as a rule. Moreover, as to the data other than address "8", when the sum of an exponent and respective mantissa word lengths is "f" or less, the data are in difference data, whereas when the sum of an exponent and respective mantissa word lengths is "10" or more, the data are in linear data as shown in the above described embodiments. By the arrangement as described above, it is considered that the maximum range of the data which are intended to express is expressible, when the sum of exponent and respective mantissa word lengths is "10" at the maximum in linear data, and further that an amount of operations as to linear data is less than that of difference data in case of expanding the data, because linear data are not required for a sum calculation in case of expanding the data. Thus, provision of an extra mantissa word length is avoided to eliminate redundancy, and at the same time processing load in case of expanding data is intended to reduce. Furthermore, the case where a sum of an exponent and respective mantissa word lengths exceeds "10" will be described later.

Moreover, in pattern codes, one which has "linear" mantissa attribute with respect to all the addresses and has a value of the sum of an exponent and mantissa word lengths reaching to "10" is prepared. In FIG. 16, pattern code "111111" corresponds to the questioned pattern code. The reason for the preparation of such pattern code is in that as to any signal, the pattern code for expressing the same is allowed to exist positively.

In the example shown in FIG. 16, the exponent corresponding to the pattern code "11100" is "9", the word length assigned to the address "8" is 7 bit wherein assuming such case that the exponent becomes "a" as a result of increasing by number "1", it means to assign 7 bit to the address "8", so that the sum in an exponent and mantissa word lengths exceeds "10 (hexadecimal number)", and this is useless as described above. Accordingly, when 6 bit is assigned to the address "8" and extra 1 bit is assigned to address "2", effective word length allocation can be realized. An example of such word length allocation is that shown in a pattern code "11101".

In the example shown in FIG. 16, much bit allocation is made onto address "1" or address "3" in pattern codes "11110" and "111110" than that of the following odd number addresses. This means that a low-numbered address is affected easily by quantization errors of the final value in the preceding block, so that the low-numbered address is predominantly subjected to bit allocation.

A symbol "4L" in the pattern code "111111" means the following formula:

d+4=11>10

However, only the data of this address "8" is not used as d being the exponent common in blocks, but a smaller exponent c by "1" than that of the former exponent is used as an exception. More specifically, when a value at a lower place than the original place quantized is taken, it becomes possible to effectively use an extra storage region. <Completion of the Explanation for the First Example of Pattern Codes>.

<Commencement for the Explanation of the Second Example of Pattern Codes>

FIG. 17 shows the second example based on the same idea as that of the first example. The example shown in FIG. 17 indicates bit lengths of compression data in every addresses at 16 data/block wherein data with "L" means linear data, and the others are difference data.

Since addresses from "9" to "10" are based upon addresses from "1" to "8", illustration of the former addresses is omitted.

Furthermore, in the example shown in FIG. 17, the exponent corresponding to pattern code "0101" is "8" and the word length allocated to addresses "8" and "10" is 8 bit, respectively. In this case, assuming that the exponent is "9" as a result of increasing the aforesaid exponent by "1", so that 8 bit is allocated to the addresses "8" and "10". Consequently, the sum in word length of the exponent and the mantissa exceeds "10 (hexadecimal number)" as described above, and this is useless. In this respect, when 7 bit is allocated to the addresses "8" and "10", respectively, and further extra two bits are assigned to the word lengths of pattern codes, effective word length allocation can be made. As a result of practicing such word length allocation, the one indicated in pattern code "111100" is obtained. This situation is same as the word length allocations corresponding to the pattern codes "0101" and "111100" in the example shown in FIG. 18 which will be mentioned later.

According to the pattern codes shown in the above described FIGS. 16 and 17, the sum total of an exponent and mantissa word lengths at the respective addresses is constant concerning the respective pattern codes. As a result, compression data in one block each comes to be the same amount, so that the handling therefor becomes easy, besides since the number of compressed blocks are proportional to the amount of data compressed, such a characteristic that the compression data is easily controlled can also be obtained. <Completion of the Explanation for the Second Example of Pattern Codes>.

<Commencement of the Explanation for the Third Example of Pattern Codes>

When data are expressed in accordance with floating-point method in which word length of mantissa is made constant, there is in general such a tendency that the quantization errors increase in accordance with a magnitude of the data. However, in the case where the magnitude of the data exceeds a predetermined value, when a mantissa value having a longer word length is employed, such increase in quantization errors can be suppressed.

This manner can similarly be practicable to the case of block floating-point method. Accordingly, in the case when any of the data in blocks exceeds a prescribed value established in every addresses, when a longer -mantissa value is used for the address in question, the same advantages can be attained. With the attainment of the advantages, the sum total of the word length of a pattern code and the word length of a mantissa value may be increased. More particularly, when mantissa word lengths of all the addresses are increased by the same amount, new allocation patterns realizing the manner described above can be obtained. This principle is used in the third example of pattern codes.

FIG. 18 shows the third example of pattern codes wherein the example is the one in 16 data/block, and the addresses from "9" to "10" are based upon the addresses from "1" to "8". When FIG. 18 is explained in comparison with FIG. 17, from pattern code "110000" to pattern code "111011" are the same in exponents and mantissa word length allocations shown in both the figures.

Pattern codes "0100", "1010", and "110111" in FIG. 18 are smaller by "1" than those of FIG. 17 in respect of the exponents, while the pattern codes "0100", "1010", and "110111" in FIG. 18 are longer by "1" than those of FIG. 17 in respect of the respective mantissa word length allocations, whereby the sum total of word lengths in FIG. 18 is larger by "10" than that of FIG. 17 so that the resulting value is "50". Furthermore, pattern codes "0101", "111100", and "111101" in FIG. 18 are smaller by "2" than those of FIG. 17 in respect of the exponents,. while the pattern codes "0101", "111100", and "111101" in FIG. 18 are longer by "2" than those of FIG. 17 in respect of the respective mantissa word length allocations, whereby the sum total of word lengths in FIG. 18 is larger by "20" than that of FIG. 17 so that the resulting value is "60". Moreover, pattern code "1011" in FIG. 18 is smaller by "3" than that of FIG. 17 in respect of the exponent, while the pattern code "1011" in FIG. 18 are longer by "3" than that of FIG. 17 in respect of the respective mantissa word length allocations, whereby the sum total of word lengths in FIG. 18 is larger by "30" than that of FIG. 17 so that the resulting value is "70". Still further, pattern codes "111110", and "111111" in FIG. 18 are smaller by "4" than those of FIG. 17 in respect of the exponents, while the pattern codes "111110", and "111111" in FIG. 18 are longer by "4" than those of FIG. 17 in respect of the respective mantissa word length allocations, whereby the sum total of word lengths in FIG. 18 is larger by "40" than that of FIG. 17 so that the resulting value is "80".

As described above, in FIG. 18, word lengths of the respective mantissa are made longer by an amount of the difference in the exponent which is made smaller than that of FIG. 17. As a result, the sum of exponent in every respective mantissa addresses of the respective pattern codes and mantissa word length is the same in both FIGS. 17 and 18.

In usual signals,.generation of respective pattern codes exhibits such a tendency that the larger exponent provides the smaller frequency of the generation, when the exponents shown in FIG. 17 exceed a certain value. Whereas in the case of employing the second example of pattern codes shown in FIG. 17, when a block with a large exponent, i.e. having large quantization errors is produced at places, there arises a case where the quality of a signal wherein compression data have been expanded deteriorates. In this respect, however, when the third example of the pattern code shown in FIG. 18 is used, the exponents in the blocks containing large exponents in the pattern codes shown in FIG. 17 can be reduced. Furthermore, these blocks exhibit a comparatively small frequency on the whole, so that an amount of the whole compression data does not so increase. As a consequence, an improvement in quality of the signal expanded can be attained without accompanying remarkable increase in the total amount of the compression data.

Furthermore, pattern codes can suitably be prepared based on the above described principle, so that they are not limited to those shown in FIGS. 16, 17, and 18, as a matter of course.

<Completion of the Explanation for the Third Example of Pattern Codes>

<Commencement of the Explanation for the Fourth Example of Pattern Codes>

In the case when the invention relating to the compression method and the expansion method illustrated in the first and second examples of the pattern codes which have already been described is applied to aural waveforms, one may be presumed at a certain degree with respect to sensory property in noise due to quantization errors in reproduced data on the basis of the distribution of a magnitude of difference data or linear data in respective blocks. Accordingly, when a position of the least place of significant figures of mantissa data is shifted to the upper or the lower place than that of its usual place based on the above described distribution, a compression apparatus and an expansion apparatus by which favorable reproduced data are formed in view of auditory sense from a small amount of compressed data can be provided.

It is to be noted that the undermentioned judgment based on auditory sense such as impression on noise and the like is relevant to the results in the experiments conducted by the present inventors.

According to the undermentioned method for deciding pattern codes, one pattern code corresponds to each block, and when impressions in auditory sense on noises due to quantization errors of reproduced data corresponding to the respective pattern codes are compared with each other, it was found that there were remarkable differences. More specifically, concerning a reproduced data corresponding to a certain pattern code, a noise due to quantization errors is considerably offensive to the ear in auditory sense, while concerning a reproduced data corresponding to another pattern code, the quantization errors at its reproduced value are not so offensive to the ear in auditory sense.

In this connection, when the following modification is applied to a position of the least place of a mantissa in case of quantizing the mantissa, a compression apparatus and an expansion apparatus in which noise in auditory sense is more reduced can be provided without changing considerably an amount of compression data as a whole. More specifically, in a pattern code expressing waveform data accompanying remarkable noise in auditory sense, positions of the least places of respective mantissas are changed to lower places than that indicated by the corresponding exponents at a degree based on which the noise becomes not so remarkable in auditory sense. On the contrary, in a pattern code expressing waveform in which noise is inoffensive in auditory sense, positions of the least places of the respective mantissas may be changed to upper places than that indicated by the corresponding exponents to reduce an amount of compression data within a range in which increase of noise can be permitted from a viewpoint of auditory sense. The above description amplifies the first principle used in the fourth example of pattern codes.

Furthermore, if the present invention is applied at a sufficiently high sampling rate, a compression apparatus and an expansion apparatus wherein a smaller amount of compression data is used can be provided by utilizing such a fact that a signal at a certain low level contains relatively little high frequency component and by thinning down waveform data at a certain interval and then, compressing and expanding the resulting data without so damaging the quality of data reproduced. This arrangement is based on such a property of waveform that, in general, even if a waveform containing little high frequency component is sampled at a lower sampling rate, the quality thereof is not deteriorated. It is to be noted that thinning down waveform data at a certain interval is equal to sample the waveform at a lower sampling rate.

According to the above described principle, difference data of odd number address are not formed, but compression data composed of only even number address are formed in a compression process of a block corresponding to a pattern code the exponent of which indicates, e.g. "3" or less, whereas in an expansion process, reproduced data of even number address are formed by a usual expansion process and as to odd number address, reproduced data are obtained by adopting a value presumed from the even number addresses which have already been reproduced and positioned before and behind the corresponding odd number address.

Furthermore, concerning a pattern code the exponent of which indicates "1" or less, difference data of the address the aliquant part of which is "4" are not formed, but compression data composed of only data of addresses being multiples of "4" are formed, while in case of expansion process, reproduced data of addresses being multiples of "4" are formed in accordance with a usual expansion process as described above. Further, regarding the data of address the aliquant part of which is "4", reproduced data are obtained from a value presumed from the reproduced data of addresses being multiples of "4" which have already been reproduced before and behind the aforesaid data of address the aliquant part of which is "4". The above description amplifies the second principle used in the fourth example of pattern codes.

The fourth example of pattern codes of FIG. 19 is constituted by this principle wherein a pattern code indicates exponent, mantissa word length, mantissa attribute, besides amount of change in position of the least place of mantissa, respectively. Based on the above described first principle, each pattern code indicates an amount of change in a position of the least place of mantissa wherein a positive number means to change the least place of a mantissa to an upper place than the original place thereof, whereas a negative number means to change the least place of a mantissa to a lower place than the original place thereof. For instance, "change in the least place of mantissa" of the pattern code "11101111" indicates "-2". This indication means to extend the significant digit of the mantissa to the place being 2 bit lower than a usual exponent d indicated by this pattern code. In other words, for example, mantissa data of address "1" is usually linear data having word length "3", but in the above described case, the word length is extended to "5". Likewise, for example, "change in the least place of mantissa" in pattern code "0001" indicates "1", and this means to cut off significant digit at 1 bit upper place than the usual exponent "3" indicated by this pattern code. Accordingly, for instance, the mantissa data of address "2" are difference data of word length "4" in general, but in reality, the word length thereof is cut off at "3".

In the fourth example of the pattern codes shown in FIG. 19, regarding mantissa word length indicated in pattern codes "0001" and "110*110*", there are mantissa word lengths in parentheses as to some addresses, and they have been provided on the basis of the above described second principle. Judgment whether all the data contained in a block in question can be expressed by these pattern codes or not is made with taking also into consideration of the mantissa word lengths in parentheses. In this connection, the aforesaid mantissa of the addresses in parentheses mean that they are not served for compression data. Furthermore, in pattern codes corresponding to an exponent of "3" or less, mantissa lengths corresponding to odd number addresses are designated by "-", and further in pattern codes corresponding to an exponent of "1" or less, there are also such mantissa lengths corresponding to aliquant addresses by "4" designated by "-". They are also provided on the basis of the above described second principle. In this case, the data of the addresses in question are not the object for such consideration whether all the data contained in a block in question can be expressed or not by these pattern codes, and this indicates the addresses wherein the mantissa is not served for compression data.

In FIG. 19, symbol "*" contained in, for example, pattern code "1011" is provided for indicating more positively the positions at which pattern codes are to be disposed in case of forming compression data wherein mantissa data are disposed at the positions indicated by "*".

Of course, an amount of change in a position of the least place of mantissa in respective pattern codes in the present embodiment can suitably be varied dependent upon various conditions such as a quality in auditory sense of required reproduced data, an amount of permissible compression data and the like in a variety of applications of the present invention. <Completion of the Explanation for the Fourth Example of Pattern Codes>.

<Commencement of the Explanation of Method for Deciding Pattern Codes>

In case of deciding pattern codes, difference data are prepared by the above described binary difference process, and a storable bit number is examined in accordance with a mantissa word length of each address indicated by pattern codes, whereby an exponent is decided.

More specifically, difference data of the respective addresses are prepared by the binary difference process. Then, selected is such a pattern code wherein a value obtained by an exponent which is indicated by the undermentioned pattern code to a prescribed word length of each address indicated by the pattern code in question reaches the uppermost place of significant figures of the data corresponding to the attribute represented by the pattern code in question of the respective addresses, and in addition, the exponent is minimized. In this case, if there are a plurality of pattern codes satisfying the above described condition, one of the pattern codes the sum total of the word length of which is the smallest is selected. Furthermore, if there are still a plurality of pattern codes, any of them may be selected.

Next, a method for deciding pattern codes will be described herein. First, the uppermost place m(i) of significant figures is determined with respect to data b(i) of each address i prepared by the binary difference process. Namely, the uppermost place m(i) indicates a position of the least place of continually arranged "0" from the uppermost bit in the case when the least bit is counted as 1st bit, or a position of the least place of continually arranged "1" from the uppermost bit. A method for deciding the uppermost place m(i) of significant figures may be the one in which, for instance, b(i) is left-shifted, the minimal shift amount is represented by s(i) in such that the uppermost place is "01" or "10" (provided that b(i) is "0", s(i) is represented by f), and "m(i)=10-s(i)". On one hand, a sum of exponent and mantissa word length represents the uppermost place of expressible significant figures. Accordingly, such a condition that "the sum of a relevant exponent and a relevant mantissa word length is m(i) or more with respect to all the addresses i" is satisfied for a certain pattern code, data b(i) can be expressed by the word length pattern indicated by the pattern code in question.

The respective pattern codes are examined as to whether the above described condition is satisfied or not in numerical order of the exponents and among the same exponents, the examination is conducted in accordance with the order from the smaller to larger sum total of the word length of a pattern code and each mantissa word length. In two pattern codes being equal to each other in the sum totals of exponents and word lengths, the order is regardless. While proceeding the examination, when a pattern code satisfying the above condition is found, the pattern code is selected and the examination is ceased. In pattern code tables, a pattern code in which "exponent+mantissa word length" is "10" or more is positively provided for all the addresses, so that the pattern code satisfying the above condition is found without fail.

When the above described principle is applied to the pattern codes shown in FIG. 16, pertinent pattern codes can be selected. The same shall apply to the pattern codes shown in FIGS. 17 and 18, besides to the other pattern codes.

Furthermore, a slightly different principle from the above described principle is applied to the fourth example shown in FIG. 19. As mentioned above, in the fourth example, an amount of change at the least place of mantissas in every pattern codes is determined. For convenience' sake of the following explanation, the sum total of mantissa word length and exponent word length with taking into consideration of changing the least place of the mantissa is hereinafter referred to simply as "total sum of word lengths". In case of deciding pattern codes, the examination for the above-mentioned condition is made with respect to the pattern codes in accordance with such order of from a pattern code corresponding to a smaller exponent to that corresponding to a larger one. Thereafter, a pattern code having a smaller sum total of word lengths may be predominantly selected among the same exponents, and they may be examined. On the contrary, a pattern code having a larger sum total of word lengths may be predominantly selected and examined. Furthermore, a priority order of the selection and the examination may be decided based on the experimental results as in the case conducted by the present inventors as mentioned below, or any other suitable selecting methods may be employed. In this connection, a predominant selection of a smaller sum total of word lengths is intended to contribute for reducing compression data, a predominant selection of a larger sum total of word lengths is intended to contribute for reducing quantization errors, and further a decision for the priority order of selection based on experimental results as in the case by the present inventors is intended to favorably balance between reduction of compression data and reduction of quantization errors.

In FIG. 19, when, for example, pattern code "1001" is compared with one "111*100*", they have the same exponent "9", while the former has an amount of change at the least place of mantissas "−1" and the latter has that of "−2". Based on experimental results, the present inventors judge that there is no problem in view of auditory sense, even if a certain degree of quantization errors is permitted with respect to a signal being commonly expressed by both the pattern codes, the pattern code "1001" wherein the least place of mantissas is changed to an upper place is predominantly assigned. The table in FIG. 19 is prepared by repeating similarly the experiments as described above, and in accordance with such intention that the pattern code shown in an upper row is to be predominantly selected regarding a plurality of pattern codes having the same exponents.

Moreover, as in the above described fourth example, there is a case where mantissa data of an address are not served for compression data dependent upon addresses. In such case, the following procedure is taken. Namely, such examination whether or not the data b(i) can be expressed by a pattern code "0001" or "110*010*" corresponding to exponent "3" is first conducted. In this case, mantissa word lengths in parentheses indicated by the above described both pattern codes in FIG. 19 are also examined. As mentioned above, since the principle in the fourth example utilizes such fact that a signal at somewhat low level contains little higher harmonic component, it is required whether data is small or not is examined over all the addresses.

In the case where the data b(i) cannot be expressed by both the aforesaid pattern codes "0001" and "110*010*", the first principle for deciding pattern codes in the above described fourth example is applied similarly to the data b(i) from pattern codes corresponding to exponent "4" in due order.

When the data could be expressed by either of the above described pattern code "0001" or "110*010*", the examination whether or not only the data of even number address, as the object, can be expressed by the pattern code "110*000*" is conducted. As a result, if the data cannot be expressed by the above described pattern code "110*000*", the above described principle for deciding pattern codes is applied from exponent "2" onto even number addresses as the object. In this case, it has already been ensured that the data in question can be expressed by the pattern code corresponding to exponent "3", so that the objective data can be expressed by either of a pattern code corresponding to exponent "2" and a pattern code corresponding to exponent "3". On one hand, when the data of the above described even number address can be expressed by the pattern code "110*000*", it is examined whether only the addresses of multiples of "4", as the objects, can be predominantly expressed by pattern code "11111011", but not pattern code "11111100". As a result, if the data can be expressed, the resulting pattern code is adopted, and if not, the pattern code "110*000*" is adopted.

Furthermore, in the case where patterns in which the attributes and the word length allocations of respective mantissas coincide perfectly with each other exist with respect to a plurality of pattern codes as in the case of the pattern codes shown in FIG. 16, an optimal pattern code can be slightly advantageously selected in accordance with the following manner. Of course, the same manner is also applicable to the pattern codes shown in FIGS. 17, 18, and 19.

Namely, the judgment whether or not an objective data b(i) to be expressed can be expressed by a mantissa word length pattern indicated by a certain pattern code may also be effected by examining that "whether the maximum value among (m(i)-mantissa word lengths) of respective addresses is equal to or less than the exponent indicated by the pattern code in question" with respect to the mantissa word length allocation pattern of the target pattern code in place of the judgment for satisfaction of the above described condition. In the case where a plurality of pattern codes having the same patterns exist with respect to the above-mentioned attributes and word length allocations of mantissa, when it is examined whether the above described maximum value as to the target mantissa word length allocation pattern corresponds to the exponent of a pattern code having the aforesaid mantissa word length allocation pattern or not, the pattern code may be efficiently decided.

However, dependent upon allocation patterns, there is a case where such addresses in which the sum of the exponent and the mantissa word length reaches "10". On one hand, since m(i) is "10" or less in any case, the sum of the exponent in question and the mantissa word length in question in this case becomes m(i) or more.

Accordingly, it has already been found that data b(i) of this address is expressible with the word length in question and the exponent in question as mentioned above, so that there is no need of processing this address in the case when the maximum value is determined among (m(i)-mantissa word lengths) of the respective addresses.

In FIG. 16, from exponent "0" to exponent "8", inclusive, indicate quite the same allocation of {2, 3, 2, 6, 2, 3, 2, 8L}, so that attention is to be paid thereto. As mentioned above, first, the uppermost place m(i) of significant figures is determined.

Figure 20:
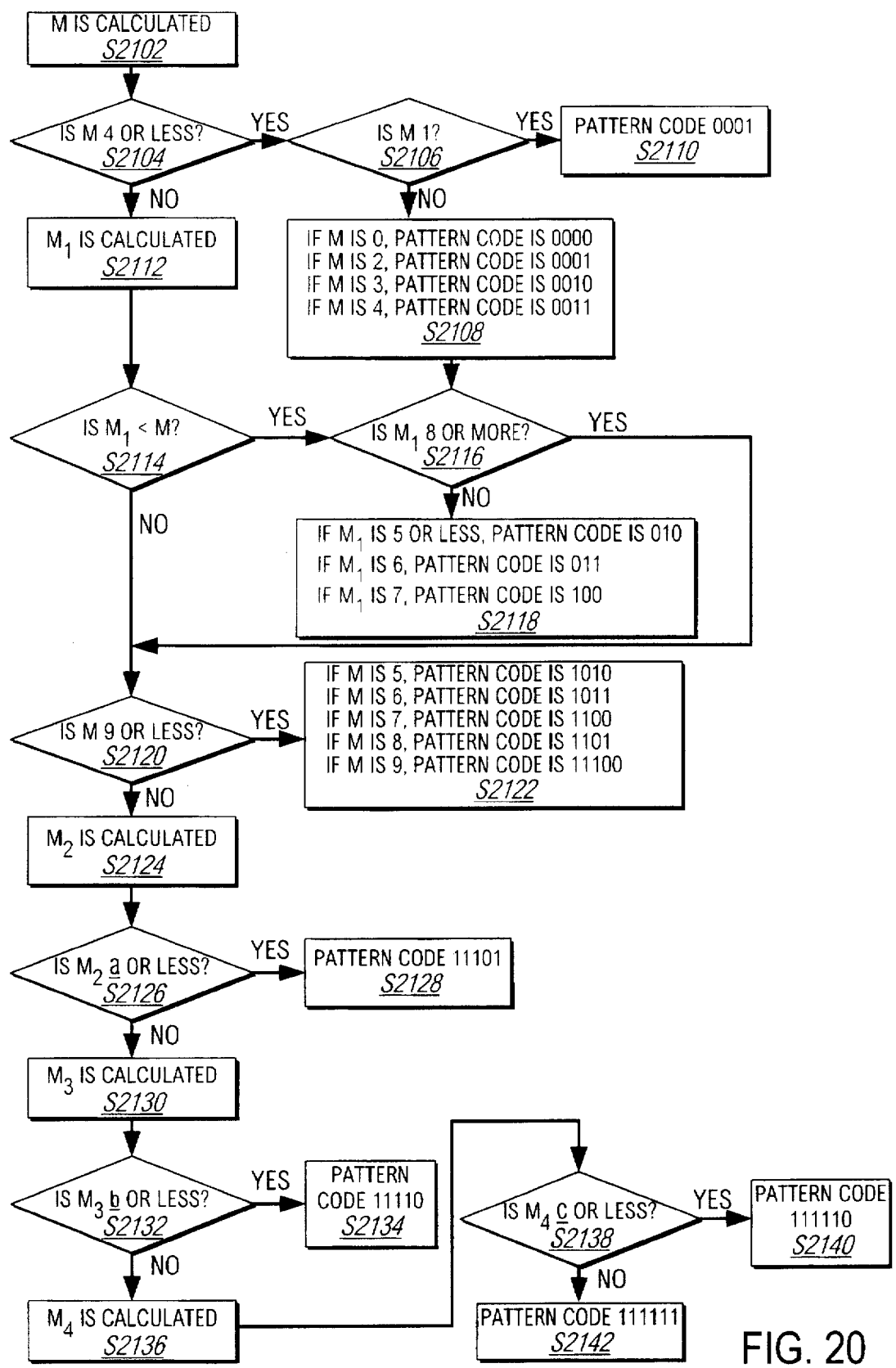
FIG. 20 is a flowchart showing a method for deciding pattern codes.

The explanation will be made by referring to the flowchart of FIG. 20. First of all, (m(i)-mantissa word lengths) are compared with respect to respective addresses i, and the resulting maximum number is expressed by "M".

More specifically, among the following mantissa word lengths:

| | |
|---|---|
| m(i) − 8 | (i = 8) |
| m(i) − 6 | (i = 4) |
| m(i) − 3 | (i = 2, 6) |
| m(i) − 2 | (i = 1, 3, 5, 7) | the maximum number is expressed by "M" (step S2102). M is the maximum value of a difference between the uppermost place of significant figures and a mantissa word length, so that this value represents "exponent" with respect to the relevant mantissa word length allocation pattern.

If the M is 0, 2, 3, or 4, a pattern code containing any of them as its exponent exists only in a single member, so that the corresponding pattern codes are independently used in the order of 0000, 0001, 0010, and 0011 (step S2104, step S2106, and step S2108). Furthermore, when M is "1", there is no pattern code containing "1" as the exponent, but in this case a pattern code containing exponent "2" immediately above the same word length allocation, i.e. 0001 is adopted (step S2110).

On the other hand, if M is a value of 5 or more, there is another bit length allocating method, so that a similar process in response to the aforesaid method is carried out.

In this case, among the following mantissa word lengths:

| | |
|---|---|
| m(i) − 9 | (i = 8) |
| m(i) − 5 | (i = 4) |
| m(i) − 4 | (i = 2) |
| m(i) − 3 | (i = 6) |
| m(i) − 2 | (i = 1, 3, 5, 7) | the maximum number is expressed by $M_1$ (step S2112).

In the case where $M_1 < M$ and $M_1$ is "7" or less, if $M_1$ is "5" or less, its exponent is "5" and its pattern code is 010; if $M_1$ is "6", its pattern code is 011; and if $M_1$ is "7", its pattern code is 100 (step S2114, step S2116, and step S2118).

In the case of $M_1 \geq M$ and in the case where even if $M_1 < M$, and if $M_1$ exceeds "7", it is confirmed whether or not the M is "9" or less (step S2120).

When M is "9" or less, pattern codes are 1010, 1011, 1100, 1101, and 11100 in response to M=5, 6, 7, 8, and 9, respectively (step S2122).

A mantissa word length allocation pattern of the pattern code 11100, i.e. in case of exponent "9", is {2, 3, 2, 6, 2, 3, 2, 7L}, so that the sum of the exponent "9" and the mantissa word length "7" of address "8" reaches "10 (hexadecimal number)", and hence fundamentally the address "8" must be excluded from the objects to be processed to determine an exponent. However, the exponent M which is determined by adopting a mantissa word length of the address "8" as "8" at step S2102 is used without any modification.

Since the maximum value of the uppermost place m(8) of significant figures of the address "8" is "10", always "m(8) −8 ≤ 10−8=8" in the case where a mantissa wave length of the address "8" is "8", so that the value does not reach "9". On the other hand, the case when M becomes "9" at step S2102 is the event where the maximum value of (m(i)-mantissa word length) is "9". Accordingly, in this case, it means that the (m(i)-mantissa word length) of any address other than the address "8" is "9". In other words, the result of the case where M which is determined by employing a mantissa word length of the address "8" as "8" is "9" is the same as that of the case where an exponent determined by excluding the address "8" from the objects to be processed is "9". According to the reason as described above, the result wherein M is determined by employing a mantissa word length as "8" with respect to the address "8" is applicable for the selection of pattern code 11100. Thus, it may be judged that the pattern code is 11100 in the case when the M determined at step S2102 is "9".

In the case when the M exceeds "9", among the following mantissa word lengths:

| m(i) − 4 | (i = 2) |
|---|---|
| m(i) − 3 | (i = 6) |
| m(i) − 2 | (i = 1, 3, 5, 7) | the maximum number is expressed by $M_2$ (step S2124), and when $M_2$ is a or less, its pattern code is 11101 (step S2126, and step S2128).

The reason why there is no number corresponding to addresses "&n 4" and "8" is no need of consideration of data, because the word lengths reach the uppermost place of the significant figures in also this case. The same shall apply hereinafter, so that data of the address the word length of which reaches the uppermost place of the significant figures is not considered.

When $M_2$ exceeds a, among the following mantissa word lengths:

| m(i) − 4 | (i = 2, 6) |
|---|---|
| m(i) − 3 | (i = 1) |
| m(i) − 2 | (i = 3, 5, 7) | the maximum number is expressed by $M_3$ (step S2130), and the $M_3$ is b or less, its pattern code is 11110 (step S2132, and step S2134).

When the $M_3$ exceeds b, in the following mantissa word lengths:

| m(i) − 3 | (i = 1, 3) |
|---|---|
| m(i) − 2 | (i = 5, 7) | the maximum number is expressed by $M_4$ (step S2136), while $M_4$ is c or less, its pattern code is 111110 (step S2138, and step S2140), and if not, its pattern code is 111111 (step S2142). <Completion of the Explanation of Method for Deciding Pattern Codes>.

<Commencement of the Explanation for Formation of Compression Data>

The above described pattern codes and mantissa data formed in accordance with the method based on the pattern codes are delivered as compression data. Pattern codes may be or may not be disposed at the head of blocks. An example of forming compression data in the case where the pattern codes shown in FIG. 18 are used is illustrated in FIGS. 21 through 24, respectively. The explanation will be made upon these FIGS. 21 through 24 wherein since it is necessary for first acquiring pattern code data in case of expanding data, positions from the head of a block in pattern code data exist at the same positions in any compression data, i.e. the positions start from the 1st bit and the 11th bit. Particularly, the first two bits of a pattern code are disposed at the beginning of compression data, and when these two bits are read, a word length of the pattern code is understood. In even general pattern codes, when a part which can decide a word length of a pattern is placed at a fixed position in the compression data, it is possible to arrange in such that the pattern code can be read uniquely. In this case, the total amount of compression data per block is in multiples of 10 bit, whereby handling thereof becomes easy. Furthermore, the mantissa data of from address "1" to address "8" and the mantissa data of from address "9" to address "10" are disposed at the positions in which these data are easily contrasted with each other in view of the fact that processing for formation of compression data and for expansion thereof are the same with respect to the mantissa data of the former addresses and that of the latter addresses.

While in the fourth example of pattern codes, the sum total of a mantissa word length corresponding to each pattern code and a word length of a pattern code takes a variety of values in accordance with changes in a position of the least place of a mantissa, a method for forming compression data is carried out by the same process as that of the previous third example, so that the explanation therefor will be omitted.

As a matter of course, "the sum total" referred herein is not the sum total of word lengths in the case where changing the least place of mantissa is ignored in case of the above-mentioned method for deciding pattern codes, but the sum total of true word lengths with taking the changes in the least place of mantissa into consideration. <Completion of the Explanation for Forming Compression Data>.

<Commencement of the Explanation for Reproducing Compression Data Attached with Pattern Codes>

The first two bits of compression data are read, and then if they are "11", a pattern code of a word length of 6 bit is acquired, while if they are not "11", a pattern code having a word length of 4 bit is acquired. Expansion of the compression data is effected in accordance with the exponent, the attribute of data, the bit length indicated in the acquired pattern code. <Completion of the Explanation for Reproducing Compression Data Attached with Pattern Codes>.

[Commencement of the Explanation Concerning Noise Shaping]

Furthermore, in the above described respective embodiments, "noise shaping" may be effected to reduce sensory noise. In the following, the "noise shaping" will be described in detail.

First, a case wherein only the data of odd number addresses are operated is explained, and then a case wherein the data of even number addresses are operated in addition to the odd number address data is explained.

1. Operation for Data of Only Odd Number Addresses

In the case when odd number address data are quantized, from the odd number address data is subtracted an arithmetic mean of quantization errors of both the adjacent even number addresses, and then the odd number address data are quantized.

Namely, in case of 8 data/block, the following operations are made.

| $a(1) = a(1) - (e(0) + e(2))/2$ |
|---|
| $a(3) = a(3) - (e(2) + e(4))/2$ |
| $a(5) = a(5) - (e(4) + e(6))/2$ |
| $a(7) = a(7) - (e(6) + e(8))/2$ |

Then, the results are served for quantization. The process as described above is referred herein to as "noise shaping".

In the above equations, e(i) (i: 1, 3, 5, 7) is quantization error (e(i)=a⁻−a(i)).

In this case, either e(0) may be practiced as "0", or a means for storing quantization errors of the final data in the preceding block is provided, and a value obtained therefrom may be used.

Furthermore, in the above described process, there is a case where a result exceeds a limit value which can be expressed by an established bit length, so that it is required to effect a detection and a processing of the same "aliasing" as that which has been described hereinabove after the application of the noise shaping.

Next, the functions in the case when the noise shaping has been effected as described above will be described.

In general, a quantization error e(i) has flat frequency characteristics. In other words, the quantization error e(i) is considered to be white noise.

Figure 25:
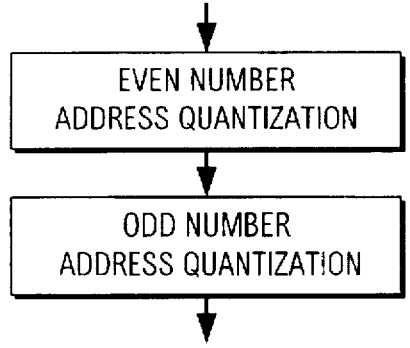
FIG. 25 is a flowchart showing a flow of quantization process of data.

Under the circumstances, quantization of data is conducted in the flow of "quantization of even number address" "quantization of odd number address" as shown in FIG. 25.

In this case, an expected value of quantization error power is identical in quantization of even number addresses and quantization of odd number addresses to each other. The quantization noises at the time of completing even number address quantization are:

$\{e(0), 0, e(2), 0, e(4), \ldots, 0, e(8)\}$ and they are alternately "0". The noise shaping corresponds to the application of a digital filter of coefficients $\{-0.5, 1, -0.5\}$ onto the above progression. (It is to be noted that even number addresses are not varied with use of this digital filter.)

Figure 26:
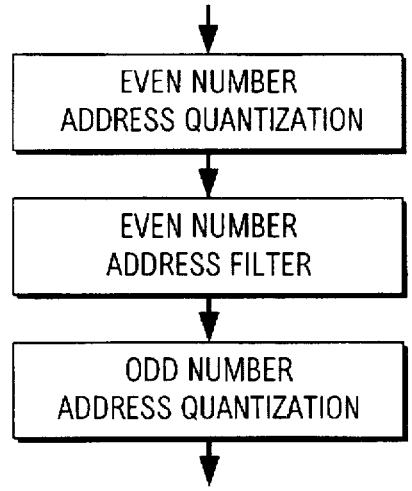
FIG. 26 is a flowchart showing a flow of the process in the case where an even number address filter is inserted in the process shown in FIG. 25.

If such digital filter as described above is referred to as "even number address filter", a flow of the process is as shown in FIG. 26.

Figure 29:
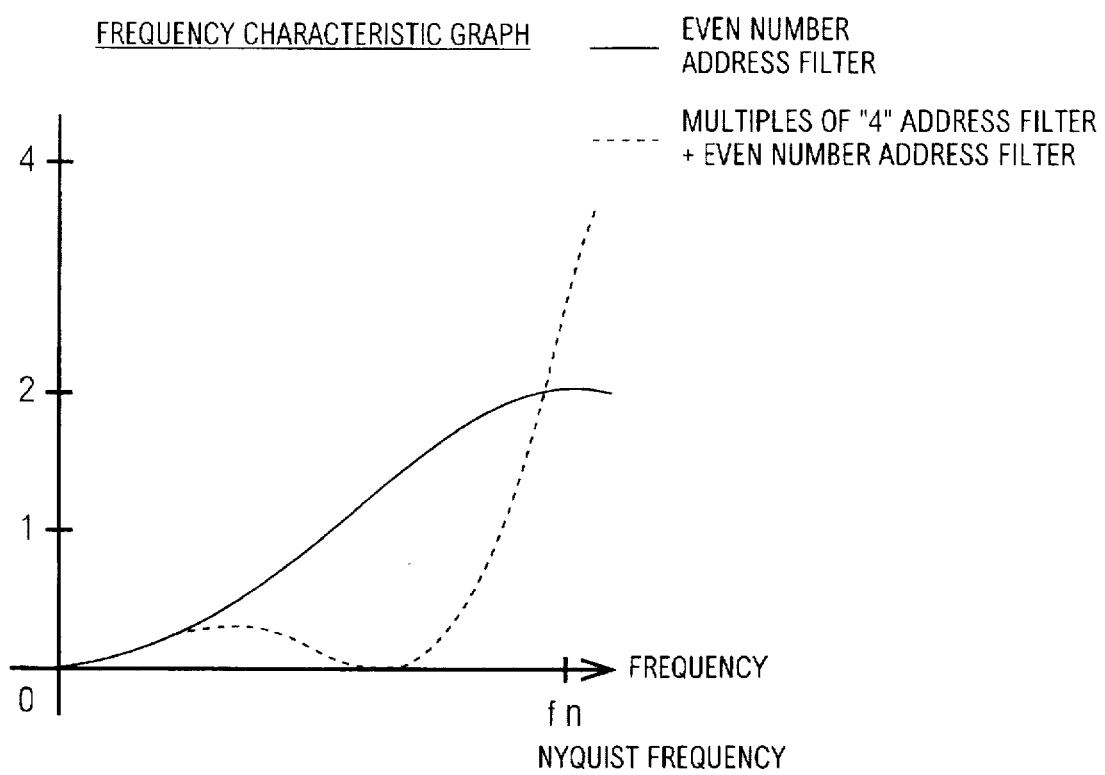
FIG. 29 is a frequency characteristic graph indicating frequency characteristics of an even number address filter and frequency characteristics obtained by accumulating frequency characteristics of the even number address filter and those of a multiples of "4" address filter.

Furthermore, this even number address filter suppresses low frequency and emphasizes high frequency as shown in frequency characteristic graphical representation of FIG. 29. However, as represented by aural waveforms and video waveforms, human sense decreases remarkably, in reality, in a frequency at a certain high degree frequency in many waveforms. For this reason, in case of a sufficient sampling rate, when the above described noise shaping is conducted, there is a noise reduction effect in sensory feeling.

2. A Case of Operating Also Even Number Address Data

For the sake of easy understanding in the following description, an example of 8 data/block case is illustrated, but other cases are the same as that of the former case. Moreover, the above described even number address filter has already been adopted.

Figure 27:
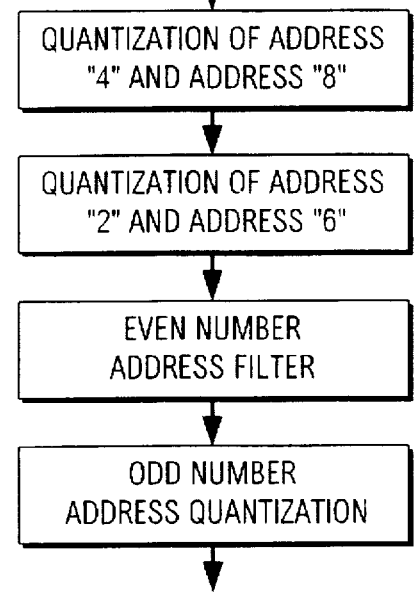
FIG. 27 is a flowchart showing a flow of the process in the case where a part of the quantization of an even number address is divided into the quantization of multiples of "4" address and another quantization in the process shown in FIG. 26.

A quantized part of even number address is divided into two sections, i.e. addresses of multiples of "4" and other addresses as shown in FIG. 27.

In these circumstances, at the time when quantization of address "4" and address "8" is finished, the following processing is carried out.

$a(2)=a(2)+(e(0)+e(4))/2$ $a(6)=a(2)+(e(4)+e(8))/2$

The above described processing is referred to as "address filter of multiples of "4"".

This address filter of multiples of "4" differs from an even address filter in a point that an arithmetic mean of quantization noise is added.

Figure 28:
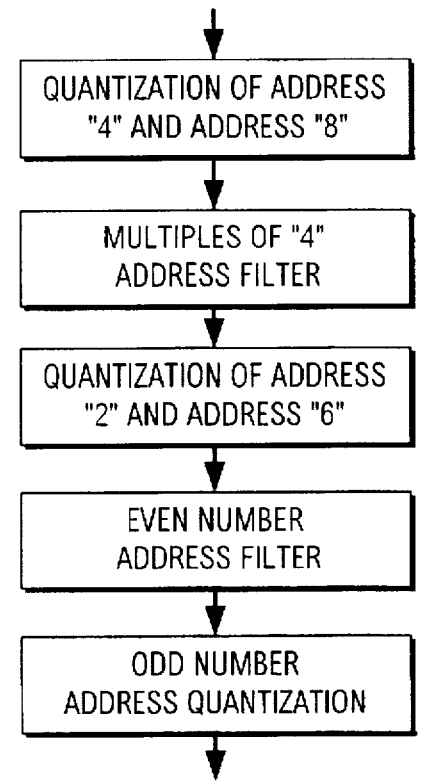
FIG. 28 is a flowchart showing a flow of the process in the case where a multiples of "4" address filter is inserted in the process shown in FIG. 27.

FIG. 28 illustrates a flow of processing in the case where an address filter of multiples of "4" is inserted into the processing shown in FIG. 27.

In the flow of processing illustrated in FIG. 28, the frequency characteristics of the address filter of multiples of "4" and the even number address filter are finally accumulated in the data of addresses of multiples of "4", so that the effects indicated in the frequency characteristic graphical representation of FIG. 29 are obtained.

An "address filter of multiples of "8" obtained by conducting the following process:

$a(4)=a(4)+(e(0)+e(8))/2$ at the time when address "8" is quantized by the same manner as that described above may also be provided, as a matter of course.

[Completion of the Explanation Concerning Noise Shaping]

Since the present invention has been constructed as described above, waveform data may further be compressed as compared with that of the prior art, so that information of higher accuracy can be obtained in even the same amount of data as that of the prior art, besides the compressed data can be expanded to reproduce the data.

Furthermore, exponents, attributes of respective data, and bit allocation amounts can be expressed by an exponent part of data prepared.

In addition, sensory noise can be reduced by operating quantization errors.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A waveform data compression apparatus comprising:

a first conjecture means for determining a first conjecture data based on at least sampled data at a first time and sampled data at a second time, said first conjecture data being the conjecture data of sampled data at a third time existing during a period of time between said first time and said second time;

a first difference means for determining a difference value between said sampled data at the third time and the first conjecture data conjectured by said first conjecture means;

a second conjecture means for determining a second conjecture data based on at least said sampled data at the first time and said sampled data at the third time, said second conjecture data being the conjecture data of sampled data at a fourth time existing during a period of time between said first time and said third time; and a second difference means for determining a difference value between said sampled data at the fourth time and the second conjecture data conjectured by said second conjecture means;

whereby data indicating a difference value of said sampled data at the third time and data indicating a difference value of said sampled data at the fourth time are produced on the basis of the difference values determined by said first and second difference means, respectively.

2. A waveform data compression apparatus as claimed in claim 1, comprising further:

a transfer means for transferring data indicating a difference value of said sampled data produced at the third time and data indicating a difference value of said sampled data produced at the fourth time to a prescribed medium; and a transfer-inactivating means adapted not to transfer at least one of the data indicating a difference value of said sampled data produced at the third time and the data indicating a difference value of said sampled data produced at the fourth time to said prescribed medium in the case when all the data among data at the prescribed number of times close to said third and fourth times or data indicating a difference value of the data which contain the data indicating a difference value of said sampled data produced at the third time and the data indicating a difference value of said sampled data produced at the fourth time are equal to or less than a predetermined value.

3. A waveform data compression apparatus as claimed in claim 1, wherein said first conjecture means and said second conjecture means utilize one or more other data in addition to said respective sampled data to determine the first conjecture data and the second conjecture data, respectively.

4. A waveform data compression apparatus as claimed in claim 3, wherein data indicating said sampled data at the second time is produced together with said data indicating a difference value of said sampled data at the third time and said data indicating a difference value of said sampled data at the fourth time.

5. A waveform data compression apparatus as claimed in claim 4, wherein said data indicating a difference value of said sampled data at the third time are expressed with a shorter data length than that of said data indicating said sampled data at the second time, and simultaneously said data indicating a difference value of said sampled data at the fourth time are expressed with a shorter data length than that of said data indicating a difference value of said sampled data at the third time, whereby these data reexpressed are produced.

6. A waveform data compression apparatus as claimed in claim 1, wherein said sampled data at the third time are conjectured by said first conjecture means based on said sampled data at the first time and said sampled data at the second time, and said sampled data at the fourth time are conjectured by said second conjecture means based on said sampled data at the first time and said sampled data at the third time.

7. A waveform data compression apparatus as claimed in claim 6, wherein said third time exists at the midpoint between said first time and said second time, while said fourth time exists at the midpoint between said first time and said third time.

8. A waveform data compression apparatus as claimed in any one of claims 1 and 6, wherein said data indicating a difference value of said sampled data at the fourth time are expressed with a shorter data length than that of said data indicating a difference value of said sampled data at the third time, whereby the data reexpressed are produced.

9. A waveform data compression apparatus as claimed in claim 7, wherein said first conjecture means uses an arithmetic mean value obtained from said sampled data at the first time and said data at the second time as the first conjecture data.

10. A waveform data compression apparatus as claimed in claim 1 wherein said second conjecture means uses an arithmetic mean value obtained from said sampled data at the first time and said sampled data at the third time as the second conjecture data.

11. A waveform data compression apparatus as claimed in claim 6, wherein said data indicating the sampled data at the second time are produced in addition to said data indicating a difference value of said sampled data at the third time and said data indicating a difference value of said sampled data at the fourth time.

12. A waveform data compression apparatus as claimed in claim 11, wherein said data indicating a difference value of said sampled data at the third time are expressed with a shorter data length than that of said data indicating a difference value of said sampled data at the second time, and simultaneously said data indicating a difference value of said sampled data at the fourth time are expressed with a shorter data length than that of said data indicating a difference value of said sampled data at the third time, whereby these data reexpressed are produced.

13. A waveform data compression apparatus as claimed in any one of claims 1, 4, 5, 6, 11, and 12, wherein said data to be produced are expressed with exponent data being common in said data to be produced together with floating-point system, and said data expressed with said common exponent data together with the floating-point system are produced as one block.

14. A waveform data compression apparatus as claimed in claim 1, comprising further:

a quantization error data acquiring means for determining at least data indicating quantization errors of said sampled data at the first time and data indicating quantization errors of said sampled data at the third time, respectively;

a data change means for changing said sampled data at the fourth time based on at least said data indicating quantization errors of said sampled data at the first time and said data indicating quantization errors of said sampled data at the third time, both of said data being determined by said quantization error data acquiring means; and a quantization means for quantizing said sampled data at the fourth time which are changed by said data change means;

whereby said sampled data at the fourth time which are quantized by said quantization means are produced.

15. A waveform data compression apparatus as claimed in claim 14, wherein said sampled data at the first time are the ones immediately before said sampled data at the fourth time, said sampled data at the third time are the ones immediately after said sampled data at the fourth time, and a difference between said sampled data at the fourth time and a mean of the data indicating quantization errors of said sampled data at the first time and the data indicating quantization errors of said sampled data at the third time, both the data being determined by said quantization error data acquiring means is determined by said data change means.

16. A waveform data compression apparatus as claimed in claim 14, wherein said sampled data at the first time are the ones two before said sampled data at the fourth time, said sampled data at the third time are the ones two after said sampled data at the fourth time, and a sum of said sampled data at the fourth time and a mean of the data indicating quantization errors of said sampled data at the first time and the data indicating said sampled data at the third time, both the data being determined by said quantization error data acquiring means is determined by said data change means.

17. A waveform data expansion apparatus comprising:

a first conjecture means for determining a first conjecture data based on at least sampled data at a first time and sampled data at a second time said first conjecture data being the conjecture data of sampled data at a third time existing during a period of time between said first time and said second time;

a first addition means for adding said first conjecture data determined by said first conjecture means to data indicating a difference value of said sampled data at the third time to produce the result as the expanded data at the third time;

a second conjecture means for determining a second conjecture data based on at least said sampled data at the first time and said expanded data at the third time which is produced by said first addition means, said second conjecture data being the conjecture data of sampled data at a fourth time existing during a period of time between said first time and said third time; and a second addition means for adding said second conjecture data determined by said second conjecture means to data indicating a difference value of said sampled data at the fourth time to produce the result as the expanded data at the fourth time.

18. A waveform data expansion apparatus as claimed in claim 17, wherein said first addition means does not perform said addition in the case where no data indicating a difference value of said sampled data at the third time exists, but produces conjecture data at the third time which is determined by said first conjecture means as said expanded data at the third time, and said second addition means does not perform said addition in the case where no data indicating a difference value of said sampled data at the fourth time exists, but produces conjecture data at the fourth time which is determined by said second conjecture means as said expanded data at the fourth time.

19. A waveform data expansion apparatus as claimed in claim 17, wherein said first conjecture means conjectures said conjecture data at the third time based on said sampled data at the first time and said sampled data at the second time, and said second conjecture means conjectures said conjecture data at the fourth time based on said sampled data at the first time and said expanded data at the third time which is produced by said first addition means.

20. A waveform data expansion apparatus as claimed in claim 19, wherein said third time exists at the midpoint between said first time and said second time, while said fourth time exists at the midpoint between said first time and said third time.

* * * * *

UNITED STATES PATENT AND TRADEMARK OFFICE
CERTIFICATE OF CORRECTION

PATENT NO. : 5,751,771
DATED : May 12, 1998
INVENTOR(S) : KATSUMATA et al.

It is certified that error appears in the above-identified patent and that said Letters Patent is hereby corrected as shown below:

In claim 9 (column 37, line 61), after "said", insert -- sampled --.

Signed and Sealed this

Third Day of November, 1998

Attest:

BRUCE LEHMAN

Attesting Officer

Commissioner of Patents and Trademarks